(12) United States Patent  
Tsukamoto et al.

(10) Patent No.: US 8,385,673 B2  
(45) Date of Patent: Feb. 26, 2013

(54) IMAGE PROCESSING APPARATUS, IMAGE PROCESSING METHOD, AND COMPUTER PROGRAM

(75) Inventors: Makoto Tsukamoto, Kanagawa (JP); Toshimichi Hamada, Tokyo (JP)

(73) Assignee: Sony Corporation (JP)

(*) Notice: Subject to any disclaimer, the term of this patent is extended or adjusted under 35 U.S.C. 154(b) by 710 days.

(21) Appl. No.: 12/587,871

(22) Filed: Oct. 14, 2009

(65) Prior Publication Data

US 2010/0104213 A1    Apr. 29, 2010

(30) Foreign Application Priority Data

Oct. 23, 2008    (JP) ................................ P2008-272890

(51) Int. Cl.  
*G06K 9/40*    (2006.01)
(52) U.S. Cl. ........................................ 382/260; 382/264
(58) Field of Classification Search .................. 382/260, 382/264, 254, 275  
See application file for complete search history.

(56) References Cited

U.S. PATENT DOCUMENTS 5,166,810 A * 11/1992 Sorimachi et al. ............ 358/462  
8,023,764 B2 * 9/2011 Miyake et al. ................ 382/275

OTHER PUBLICATIONS

Atsushi Ooi et al., "Interpolation filter for digitized image by error diffusion", Institute Of Electronics, Information and Communication Engineers technical study report (SIP 2004-9 Signal processing), May 6, 2004, vol. 104, No. 34, pp. 23-28.  
Office Action from Japanese Application No. 2008-272890, dated Jul. 29, 2010.  
Hitoshi Kiya, "Easy Understanding Digital Image Processing" 6th Edition, CQ Co. Ltd., Jan. 2000, pp. 196-213.

* cited by examiner

*Primary Examiner* — Yon Couso  
(74) *Attorney, Agent, or Firm* — Lerner, David, Littenberg, Krumholz & Mentlik, LLP

(57) ABSTRACT

An image processing apparatus includes: ΔΣ modulation means for applying, when predetermined signal processing is applied to a modulated image obtained by applying ΔΣ modulation to an image in a signal processing unit, the ΔΣ modulation to the image, wherein a frequency characteristic of noise shaping by the ΔΣ modulation is a characteristic opposite to a frequency characteristic of the predetermined signal processing.

5 Claims, 17 Drawing Sheets

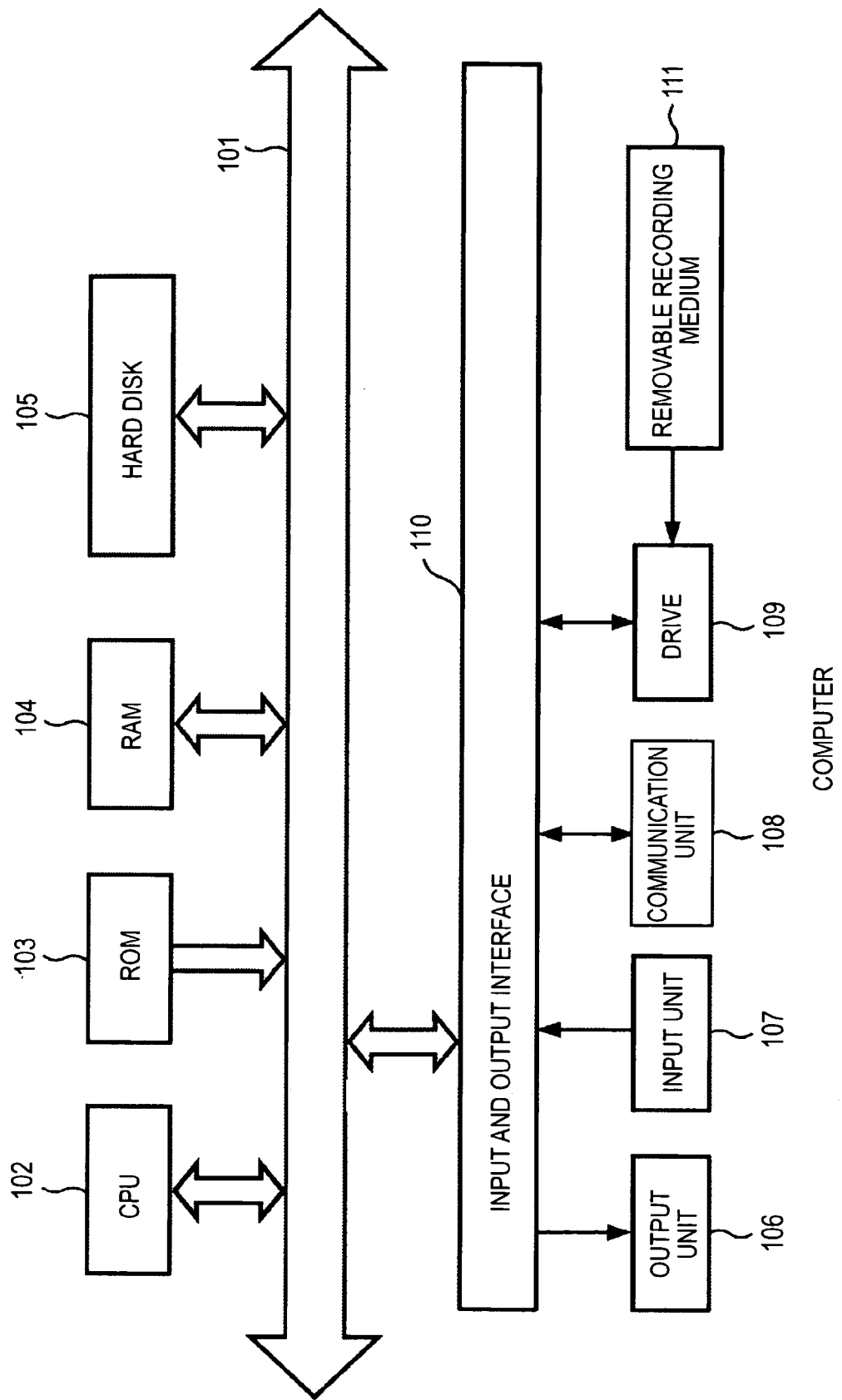

IMAGE PROCESSING APPARATUS, IMAGE PROCESSING METHOD, AND COMPUTER PROGRAM

CROSS-REFERENCE TO RELATED APPLICATION

The present application claims priority from Japanese Patent Application No. JP 2008-272890 filed in the Japanese Patent Office on Oct. 23, 2008, the entire content of which is incorporated herein by reference.

BACKGROUND OF THE INVENTION

1. Field of the Invention

The present invention relates to an image processing apparatus, an image processing method, and a computer program, and, more particularly to an image processing apparatus, an image processing method, and a computer program for making it possible to improve, for example, when predetermined signal processing is applied to an image, the gradation of an image obtained by the predetermined signal processing.

2. Description of the Related Art

FIG. 1 is a diagram of a configuration of an example of an image processing system in the past (a system refers to a logical set of plural apparatuses irrespective of whether the apparatuses having individual configurations are present in the same housing).

In FIG. 1, the image processing system includes an image-for-storage generating apparatus 10 and an image-for-display generating apparatus 20.

The image-for-storage generating apparatus 10 includes a quantization unit 11 and generates an image to be stored in the image-for-display generating apparatus 20.

The image-for-display generating apparatus 20 can be applied to, for example, a television receiver (hereinafter also referred to as TV (television)). The image-for-display generating apparatus 20 applied to the TV stores, for example, an image of a menu screen and a background image as some kind of background. The image-for-storage generating apparatus 10 generates an image stored by the image-for-display generating apparatus 20.

Specifically, a multi-bit image such as an image including 16-bit components of R, G, and B (Red, Green, and Blue) (hereinafter also referred to as 16-bit image) created by, for example, a designer as an original image of a menu screen using an image creation tool is supplied to the image-for-storage generating apparatus 10.

In the image-for-storage generating apparatus 10, the quantization unit 11 quantizes, for reduction of a volume and a calculation amount in the image-for-display generating apparatus 20, the 16-bit image, which is supplied to the image-for-storage generating apparatus 10, into, for example, 8 bits smaller than 16 bits. The image-for-storage generating apparatus 10 outputs an 8-bit image (an image including 8-bit components of R, G, and B), which is obtained by the quantization in the quantization unit 11, in an image file of a format such as PNG (Portable Network Graphics).

The image-for-display generating apparatus 20 includes a storing unit 21, a signal processing unit 22, and a gradation converting unit 23.

The storing unit 21 is, for example, a flash memory and stores the image file output by the image-for-storage generating apparatus 10.

Specifically, the image file output by the image-for-storage generating apparatus 10 is written (stored) in the storing unit 21 in, for example, a factory that manufactures the TV to which the image-for-display generating apparatus 20 is applied.

The signal processing apparatus 22 applies necessary signal processing to the 8-bit image of the menu screen stored in the image file stored in the storing unit 21 and supplies an image subjected to the signal processing to the gradation converting unit 23.

The gradation converting unit 23 gradation-converts the image from the signal processing unit 22 into the 8-bit image and supplies the 8-bit image to, for example, a not-shown display that can display the 8-bit image (hereinafter also referred to as 8-bit display).

Specifically, an image obtained as a result of the signal processing applied to the 8-bit image by the signal processing unit 22 may be an image including a lager number of bits than the 8-bit image. It is difficult to display the image including a larger number of bits than the 8-bit image on the 8-bit display. Therefore, the gradation converting unit 23 gradation-converts the image from the signal processing unit 22 into the 8-bit image.

In the gradation converting unit 23, dithering processing for adding noise to an image and then performing quantization of the image is performed as gradation conversion. In this specification, the dithering processing includes a dither method and an error diffusion method. In the dither method, noise unrelated to an image such as random noise is added to the image and then quantization of the image is performed. In the error diffusion method, (a filtering result of) a quantization error as noise is added to an image (error diffusion) and then quantization of the image is performed (see, for example, Hitoshi Tokay, "Yokuwakaru Digital Image Processing", sixth edition, CQ publishing).

The gradation converting unit 23 performs gradation conversion when the image from the signal processing unit 22 is an image including a larger number of bits than the 8-bit image. When the image from the signal processing unit 22 is the 8-bit image, the gradation converting unit 23 directly supplies the 8-bit image to the 8-bit display.

The 8-bit image of the menu screen stored in the image file of the storing unit 21 is processed as explained above and displayed on the 8-bit display when, for example, a user performs operation to display the menu screen.

SUMMARY OF THE INVENTION

With the gradation conversion by the dithering processing in the gradation converting unit 23, it is possible to simulatively realize gradation equivalent to that of a multi-bit image making use of an integral effect of human vision.

Specifically, for example, in the image-for-display generating apparatus 20 shown in FIG. 1, concerning the menu screen, since the 8-bit image is stored in the image file of the storing unit 21, it is possible to realize gradation equivalent to that of the 8-bit image.

However, concerning the menu screen, it is difficult to realize gradation equivalent to that of the image including a larger number of bits than the 8-bit image stored in the image file of the storing unit 21.

Specifically, an original image of the menu screen is the 16-bit image created by the designer. In the image-for-storage generating apparatus 10, the 16-bit image as the original image is quantized into the 8-bit image and stored in the storing unit 21 of the image-for-display generating apparatus 20.

In the image-for-display generating apparatus 20, the 8-bit image of the menu screen stored in the storing unit is signal-processed by the signal processing unit 22, gradation-converted by the gradation converting unit 23, and displayed.

In this way, the image of the menu screen is gradation-converted and displayed after the signal processing. However, in the image-for-display generating apparatus 20, since the image as a target of the signal processing is the 8-bit image, it is difficult to realize, with the gradation conversion, an image having gradation exceeding that of the 8-bit image.

Therefore, an image with gradation more substantially deteriorated than an image intended by the designer is displayed as the menu screen.

Under the circumstances, it is desirable to make it possible to improve, when predetermined signal processing is applied to an image, the gradation of an image obtained by the predetermined signal processing.

According to an embodiment of the present invention, there is provided an image processing apparatus including $\Delta\Sigma$ modulation means for applying, when predetermined signal processing is applied to a modulated image obtained by applying $\Delta\Sigma$ modulation to an image in a signal processing unit, the $\Delta\Sigma$ modulation to the image. A frequency characteristic of noise shaping by the $\Delta\Sigma$ modulation is a characteristic opposite to a frequency characteristic of the predetermined signal processing. According to the embodiment, there is also provided a computer program for causing a computer to function as the image processing apparatus.

According to another embodiment of the present invention, there is provided an image processing method including the step of applying, when predetermined signal processing is applied to a modulated image obtained by applying $\Delta\Sigma$ modulation to an image in a signal processing unit, the $\Delta\Sigma$ modulation to the image. A frequency characteristic of noise shaping by the $\Delta\Sigma$ modulation is a characteristic opposite to a frequency characteristic of the predetermined signal processing.

In the embodiments of the present invention, when predetermined signal processing is applied to a modulated image obtained by applying the $\Delta\Sigma$ modulation to an image in the signal processing unit, the $\Delta\Sigma$ modulation is applied to the image. A frequency characteristic of the noise shaping by the $\Delta\Sigma$ modulation is a characteristic opposite to a frequency characteristic of the predetermined signal processing.

The image processing apparatus may be an independent apparatus or may be an internal block included in one apparatus.

It is possible to provide the computer program by transmitting the computer program via a transmission medium or recording the computer program on a recording medium.

According to the embodiments of the present invention, it is possible to improve the gradation of an image. In particular, for example, when the predetermined signal processing is applied to an image, it is possible to improve the gradation of an image obtained by the predetermined signal processing.

BRIEF DESCRIPTION OF THE DRAWINGS

FIG. 20 is a block diagram of a configuration example of a computer according to an embodiment of the present invention.

DESCRIPTION OF THE PREFERRED EMBODIMENTS

Figure 2:
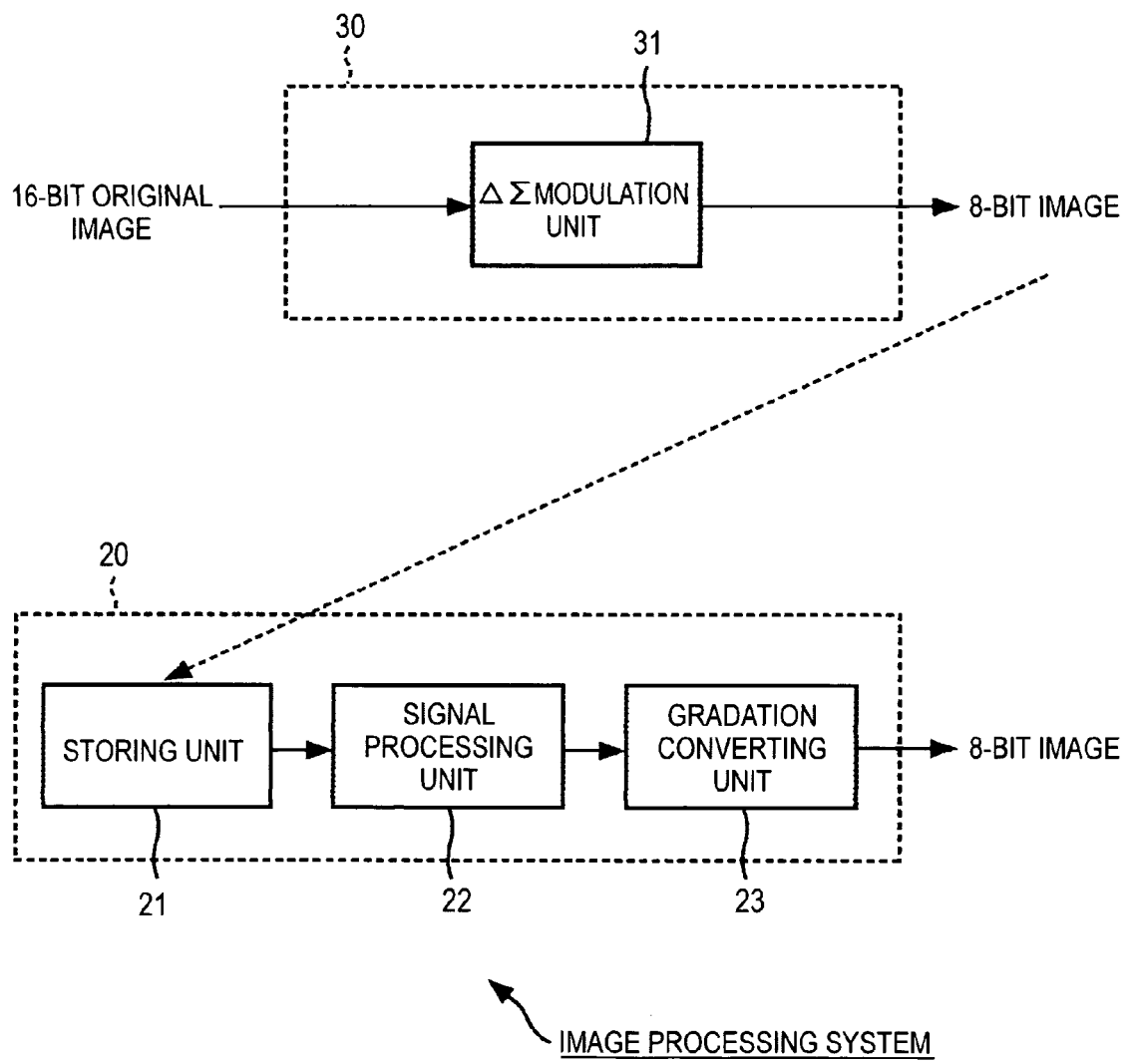
FIG. 2 is a block diagram of a configuration example of an image processing system according to an embodiment of the present invention.

An Overall Configuration Example of an Image Processing System According to an Embodiment of the Present Invention FIG. 2 is a diagram of a configuration example of an image processing system according to an embodiment of the present invention.

Figure 1:
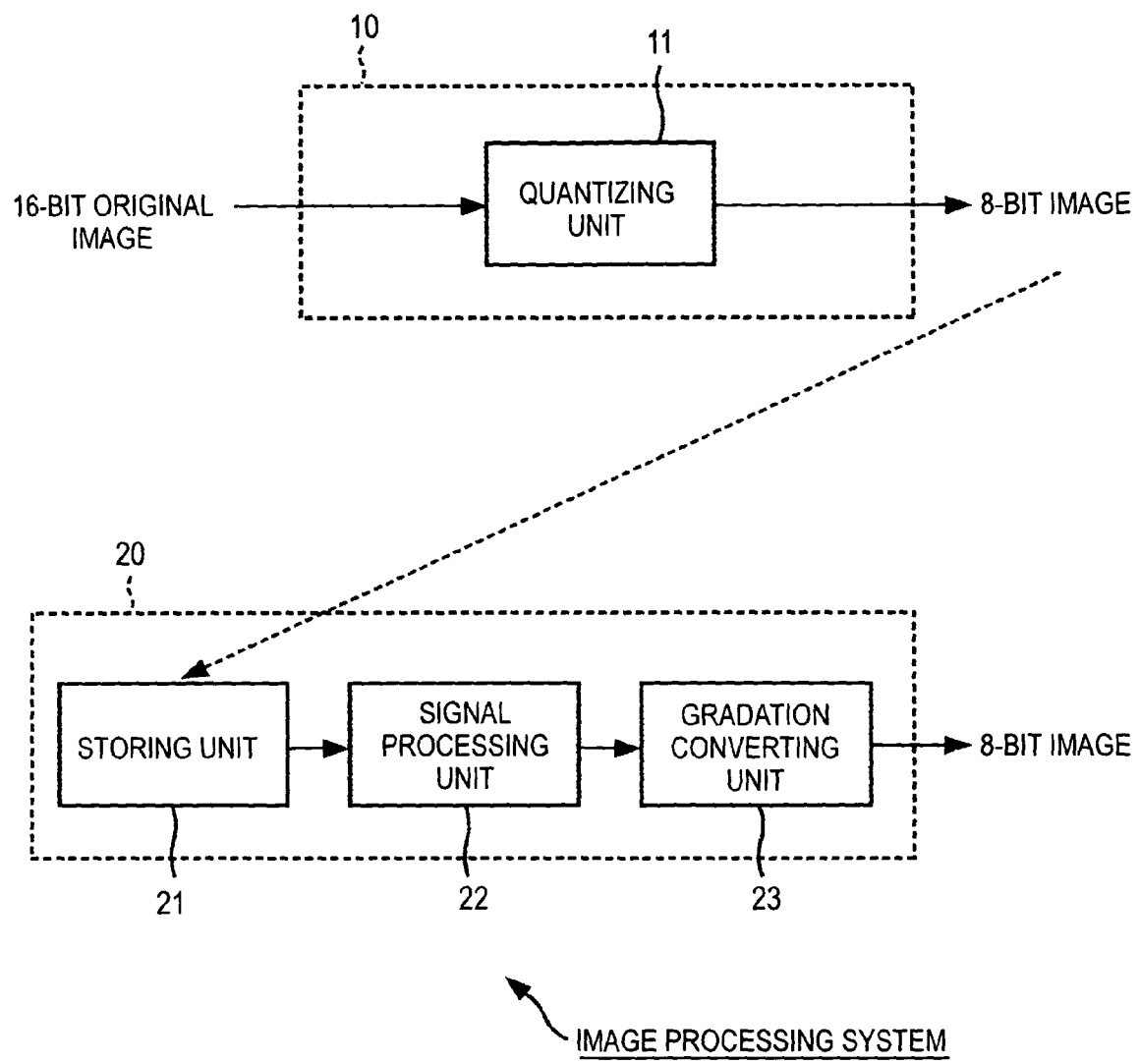
FIG. 1 is a block diagram of a configuration of an example of an image processing system in the past.

In the figure, components corresponding to those shown in FIG. 1 are denoted by the same reference numerals. Explanation of the components is omitted below as appropriate.

The image processing system shown in FIG. 2 is the same as that shown in FIG. 1 in that the image processing system includes the image-for-display generating apparatus 20. However, the image processing system shown in FIG. 2 is different from that shown in FIG. 1 in that an image-for-storage generating apparatus 30 is provided instead of the image-for-storage generating apparatus 10 (FIG. 1).

The image-for-storage generating apparatus 30 includes a $\Delta\Sigma$ modulation unit 31.

For example, a 16-bit image created by a designer as an original image of a menu screen is supplied to the image-for-storage generating apparatus 30.

To reduce a volume and a calculation amount in the image-for-display generating apparatus 20, the $\Delta\Sigma$ modulation unit 31 of the image-for-storage generating apparatus 30 applies $\Delta\Sigma$ modulation, i.e., gradation conversion by an error diffusion method to the 16-bit image supplied to the image-for-storage generating apparatus 30 and converts the 16-bit image into an 8-bit image.

In the ΔΣ modulation, noise as a quantization error of a pixel value of a pixel spatially close to a pixel of attention, which is as a pixel to which attention is paid for processing, is noise-shaped to a high band of a spatial frequency in which the sensitivity of human vision is low. Error diffusion for adding the noise after noise shaping to the pixel value of the pixel of attention is performed. A pixel value after the addition of the noise is quantized into 8 bits as a desired number of bits.

As explained above, in the ΔΣ modulation, the pixel value to which the noise (the quantization error) is added is quantized. Therefore, in the image after the quantization (after gradation conversion), when lower order bits are simply truncated, it looks as if a pixel value in a section having a fixed value is subjected PWM (Pulse Width Modulation). As a result, it looks as if the gradation of the image after the ΔΣ modulation smoothly changes because of a spatial integral effect that an integral in a spatial direction is performed in human vision. In other words, gradation equivalent to that of an original image (e.g., if the original image is the 16-bit image as explained above, $2^{16}$ gradations) can be simulatively represented.

As explained in detail later, a frequency characteristic (an amplitude characteristic) of noise shaping by the ΔΣ modulation by the ΔΣ modulation unit 31 is a characteristic opposite to a frequency characteristic of signal processing (predetermined signal processing) performed by the signal processing unit 22 of the image-for-display generating apparatus 20.

An image obtained by the ΔΣ modulation in the ΔΣ modulation unit 31 is hereinafter referred to as modulated image.

In the image-for-storage generating apparatus 30, the 8-bit image as the modulated image obtained by the ΔΣ modulation in the ΔΣ modulation unit 31 is output as an image file of a format such as PNG.

The image file output by the image-for-storage generating apparatus 30 is written in the storing unit 21 in a factory or the like that manufactures a TV to which the image-for-display generating apparatus 20 is applied.

[A Configuration Example of the ΔΣ Modulation Unit 31]

Figure 3:
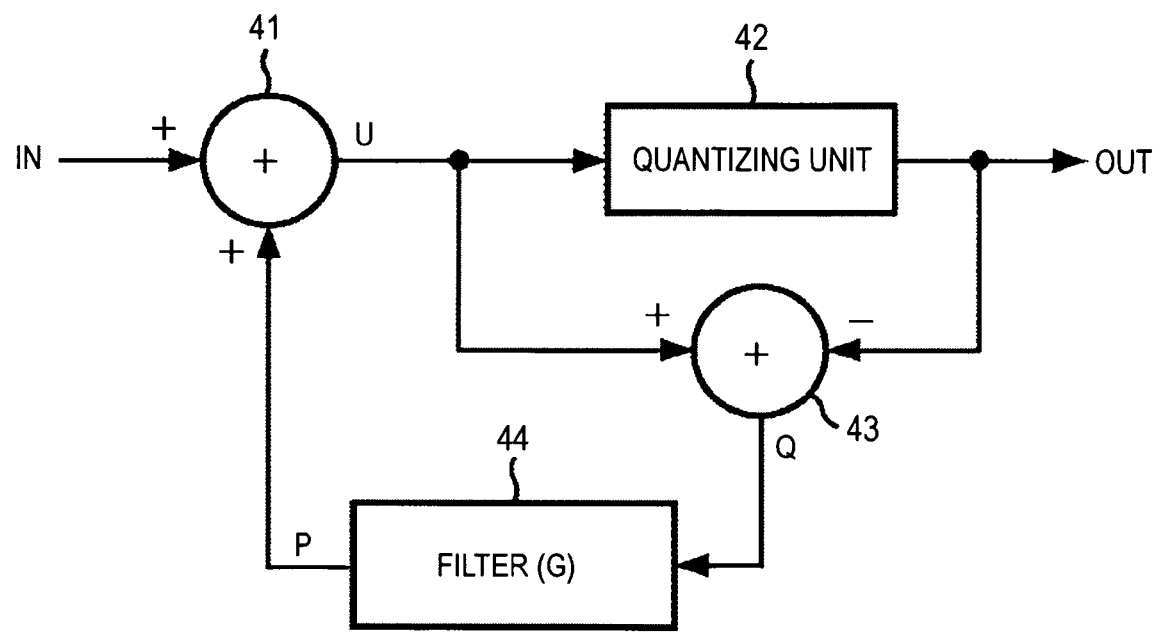
FIG. 3 is a block diagram of a configuration example of $\Delta\Sigma$ modulation unit 31.

FIG. 3 is a diagram of a configuration example of the ΔΣ modulation unit 31 shown in FIG. 2.

In FIG. 3, the ΔΣ modulation unit 31 includes an arithmetic unit 41, a quantization unit 42, an arithmetic unit 43, and a filter 44.

The 16-bit image as the original image of the menu screen is supplied to the arithmetic unit 41 as an image as a target of the ΔΣ modulation (hereinafter also referred to as target image). Further, output P of the filter 44 that performs filtering in the spatial direction of a quantization error of a quantization value obtained by quantizing a pixel value of the 16-bit image as the target image is supplied to the arithmetic unit 41.

The arithmetic unit 41 sets pixels of the target image as a pixel of attention in raster scan order and adds up a 16-bit pixel value IN of the pixel of attention and the output P of the filter 44. The arithmetic unit 41 supplies (outputs) an added-up value U obtained as a result of the addition to the quantization unit 42 and the arithmetic unit 43.

The quantization unit 42 quantizes the added-up value U as the output of the arithmetic unit 41 into, for example, 8 bits smaller than 16 bits as the number of bits of the target image. The quantization unit 42 outputs an 8-bit quantization value obtained as a result of the quantization as a modulated pixel value OUT, which is a result of the ΔΣ modulation of the pixel value IN.

The 8-bit modulated pixel value OUT output by the quantization unit 42 is a pixel value of an 8-bit image as a modulated image. The 8-bit modulated pixel value OUT output by the quantization unit 42 is supplied to the arithmetic unit 43.

The arithmetic unit 43 calculates a difference U-OUT between the added-up value U, which is the output of the arithmetic unit 41, and the 8-bit modulated pixel value OUT as a quantized value of the added-up value U, which is the output of the quantization unit 42, to thereby calculate a quantization error Q included in the modulated pixel value OUT as the quantized value and outputs the quantization error Q.

The quantization error Q output by the arithmetic unit 43 is supplied to the filter 44.

The filter 44 is, for example, a FIR (Finite Impulse Response) filter that performs filtering in two dimensions (the horizontal direction and the vertical direction) of the spatial direction. The filter 44 performs filtering in the spatial direction for the quantization error Q supplied from the arithmetic unit 43. Further, the filter 44 supplies (outputs) a result (P) of the filtering to the arithmetic unit 41.

When a transfer function of the filter 44 is represented as G, the modulated pixel value OUT output by the quantization unit 42 is represented by the following Formula (1):

$$OUT=IN-(1-G)Q \qquad (1)$$

In Formula (1), the quantization error Q is modulated by −(1−G). The modulation by −(1−G) is noise shaping by the ΔΣ modulation in the spatial direction.

[A Configuration Example of the Filter 44]

Figure 4:
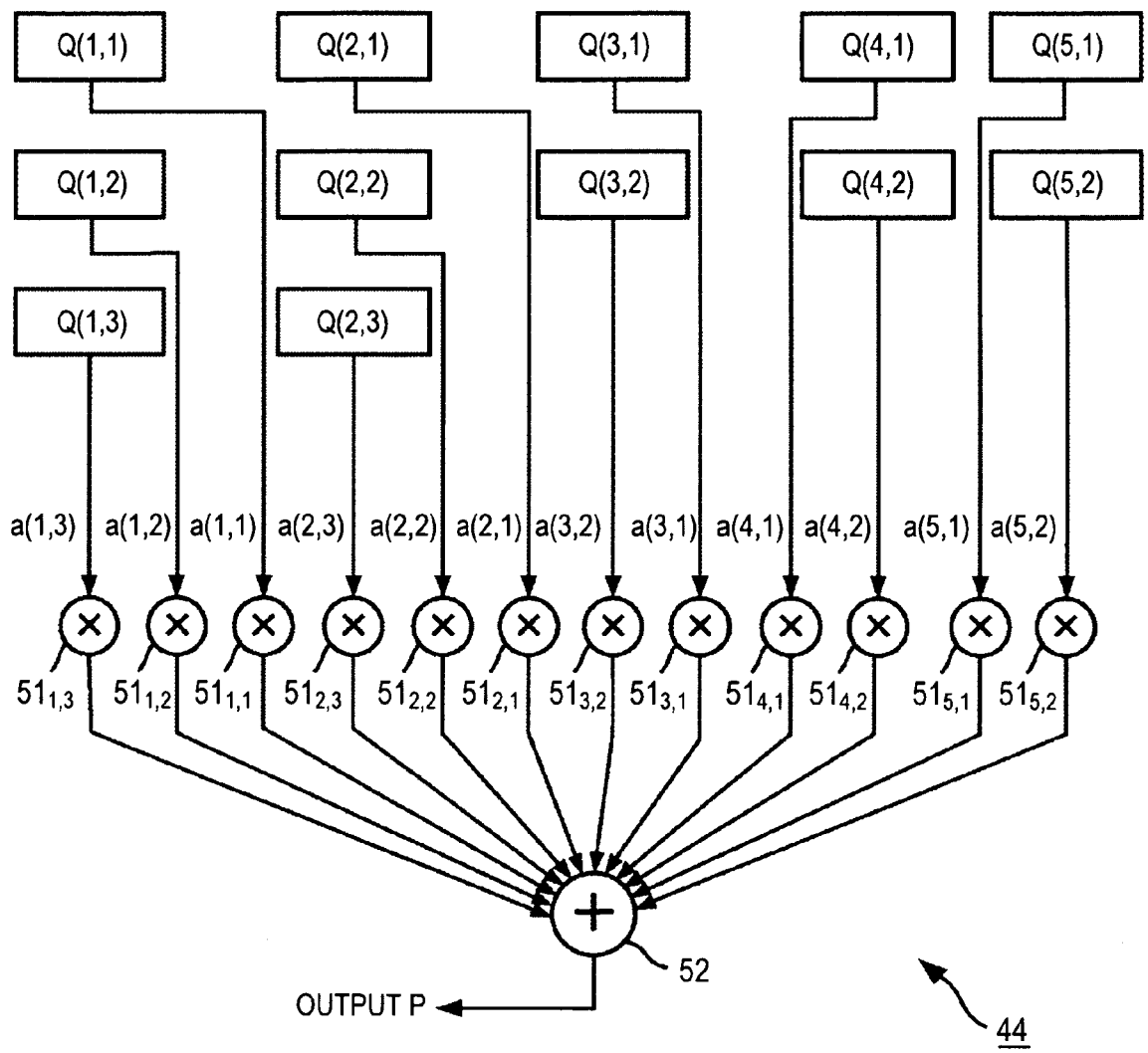
FIG. 4 is a block diagram of a configuration example of a filter 44.

FIG. 4 is a configuration example of the filter 44 shown in FIG. 3.

In FIG. 4, the filter 44 is a 12-tap two-dimensional FIR filter. The filter 44 includes twelve arithmetic units $51_{1,3}$, $51_{1,2}$, $51_{1,1}$, $51_{2,3}$, $51_{2,2}$, $51_{2,1}$, $51_{3,2}$, $51_{3,1}$, $51_{4,1}$, $51_{4,2}$, $51_{5,1}$, and $51_{5,2}$ and one arithmetic unit 52.

When a quantization error of a pixel xth from the left and yth from the top among 5×5 pixels around a pixel of attention is represented as Q(x,y), the quantization error Q(x,y) is supplied to an arithmetic unit $51_{x,y}$.

Specifically, in FIG. 4, the quantization error Q(x,y) of each of twelve pixels processed (set as a pixel of attention) earlier than the pixel of attention in raster scan order among the 5×5 pixels around the pixel of attention is supplied to the arithmetic unit $51_{x,y}$.

The arithmetic unit $51_{x,y}$ multiplies together the quantization error Q(x,y) supplied thereto and a filter coefficient a(x,y) set in advance and supplies a multiplied value obtained as a result of the multiplication to the arithmetic unit 52.

The arithmetic unit 52 adds up multiplied values supplied from the twelve arithmetic units $51_{x,y}$ and outputs an added-up value P of the multiplied values to the arithmetic unit 41 (FIG. 3) as a filtering result of the quantization error.

In the arithmetic unit 41 shown in FIG. 3, the filtering result obtained by using the quantization errors Q(x,y) of the twelve pixels processed earlier than the pixel of attention in raster scan order among the 5×5 pixels around the pixel of attention as explained above is added to the pixel value IN of the pixel of attention.

[Processing by the Image-for-Storage Generating Apparatus 30]

Figure 5:
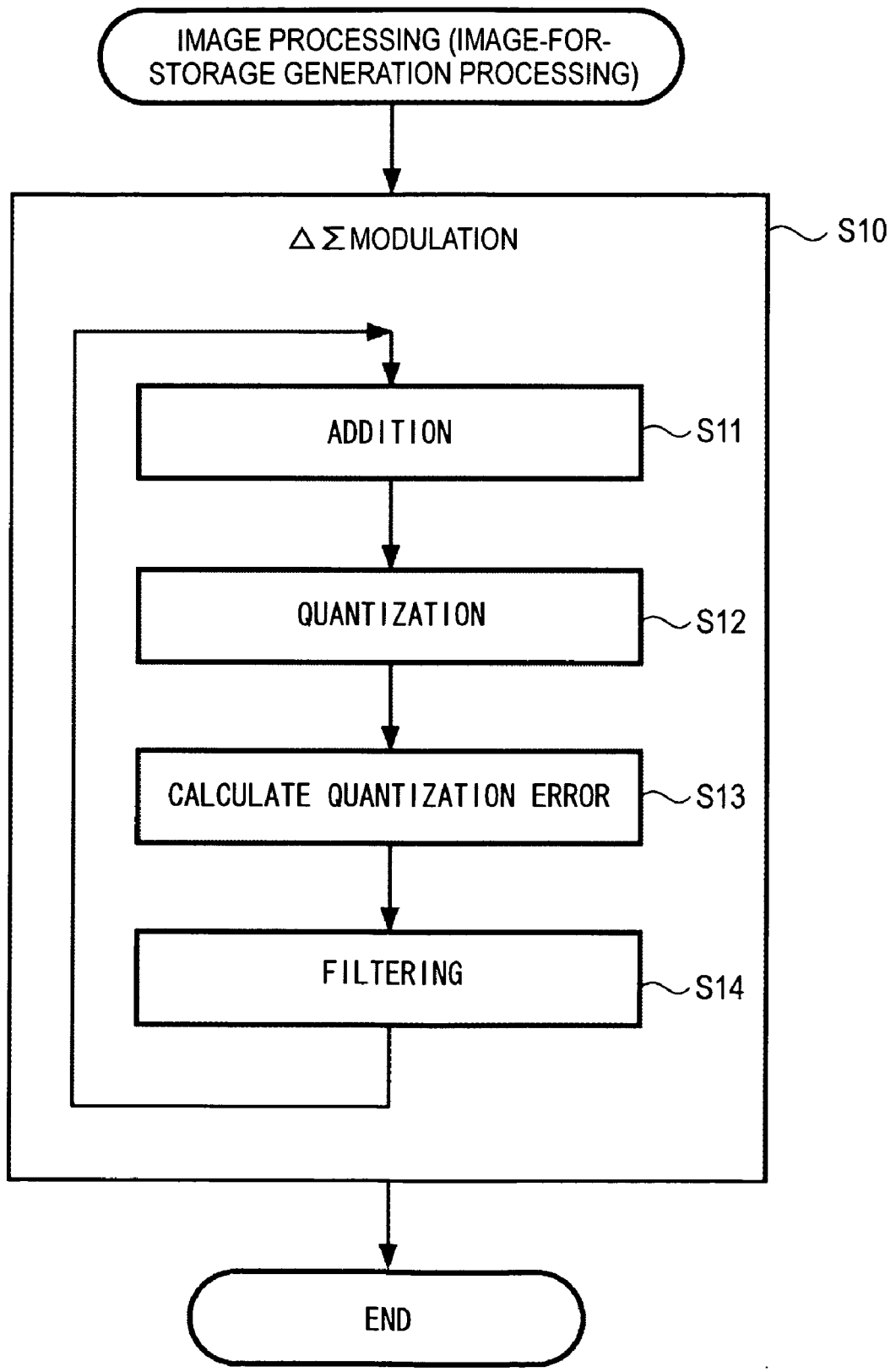
FIG. 5 is a flowchart for explaining image processing performed by an image-for-storage generating apparatus 30.

Image processing (image-for-storage generation processing) performed by the image-for-storage generating apparatus 30 shown in FIG. 2 is explained with reference to FIG. 5.

The image-for-storage generating apparatus 30 waits for a certain frame (for one screen) of the 16-bit image to be supplied thereto and receives the frame. In step S10, the imagefor-storage generating apparatus 30 performs the ΔΣ modulation with the 16-bit image set as a target image and outputs an 8-bit image obtained as a result of the ΔΣ modulation as a modulated image.

Specifically, in the ΔΣ modulation unit 31 (FIG. 3) of the image-for-storage generating apparatus 30, the arithmetic unit 41 waits for a certain frame of the target image to be supplied and receives the frame. The arithmetic unit 41 sets a pixel, which is not set as a pixel of attention yet in raster scan order among pixels of the frame, as a pixel of attention. In step S11, the arithmetic unit 41 adds up a pixel value of the pixel of attention and a value (output of the filter 44) obtained by filtering in step S14 explained later performed by the filter 44 immediately before. The arithmetic unit 41 outputs an added-up value obtained as a result of the addition to the quantization unit 42 and the arithmetic unit 43. The processing proceeds to step S12.

In step S12, the quantization unit 42 quantizes the added-up value, which is the output of the arithmetic unit 41, and outputs a quantized value including a quantization error as a modulated pixel value of a pixel in the position of the pixel of attention of the modulated image. The processing proceeds to step S13.

The modulated pixel value as the quantized value output by the quantization unit 42 is supplied to the arithmetic unit 43.

In step S13, the arithmetic unit 43 calculates a difference between the added-up value as the output of the arithmetic unit 41 and the output of the quantization unit 42 (the quantized value of the added-up value as the output of the arithmetic unit 41) (the modulated pixel value) to thereby calculate a quantization error due to the quantization by the quantization unit 42. Further, the arithmetic unit 43 supplies the quantization error to the filter 44. The processing proceeds from step S13 to step S14.

In step S14, the filter 44 performs filtering in the spatial direction of the quantization error supplied from the arithmetic unit 43 and supplies (outputs) a result of the filtering to the arithmetic unit 41.

Thereafter, the arithmetic unit 41 sets the next pixel of the pixel of attention as a new pixel of attention in raster scan order. The processing returns from step S14 to step S11. The arithmetic unit 41 adds up a pixel value of the new pixel of attention and the filtering result supplied from the filter 44 in the immediately preceding step S14. The same processing is repeated.

The processing from steps S11 to S14 is repeatedly performed until the supply of the 16-bit image to the image-for-storage generating apparatus 30 is stopped.

[A Configuration Example of a TV to which the Image-for-Display Generating Apparatus 20 is Applied]

The image-for-display generating apparatus 20 shown in FIG. 2 (and FIG. 1) can be applied to an apparatus that treats an image such as a TV.

Figure 6:
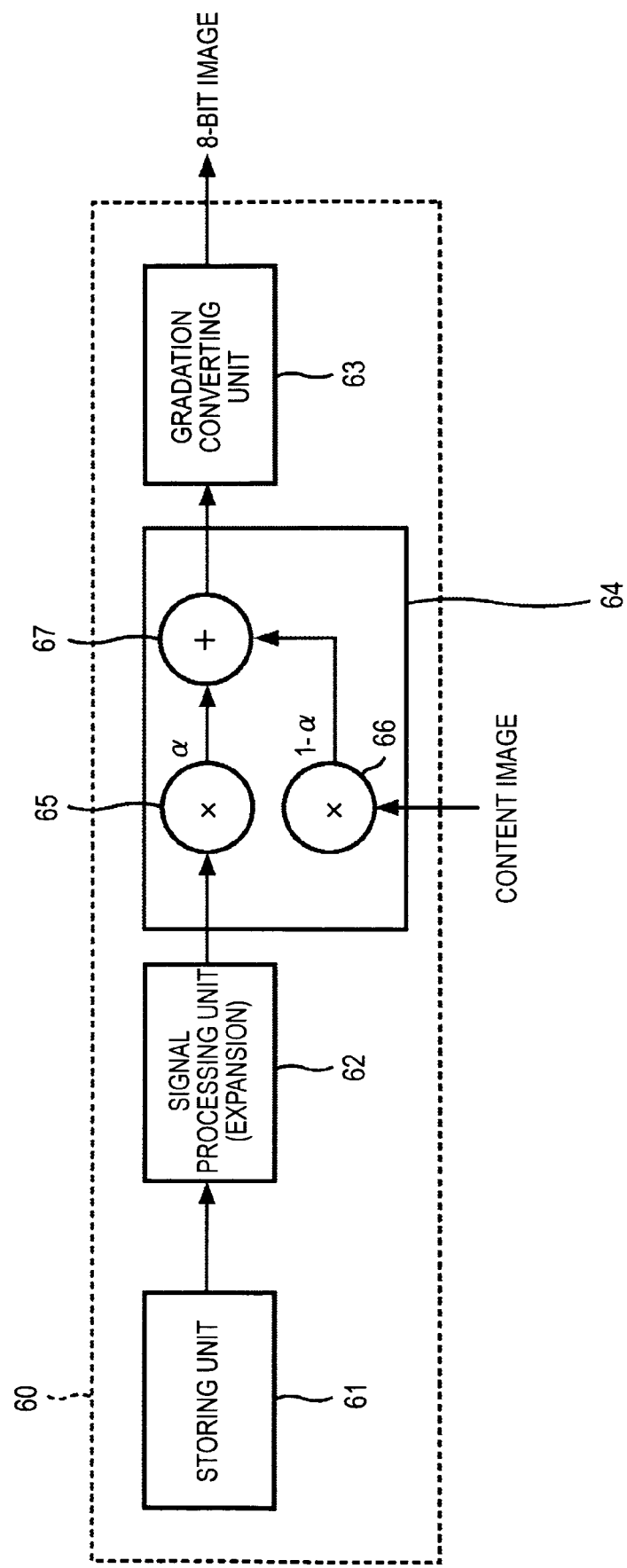
FIG. 6 is a block diagram of a configuration example of a TV to which an image-for-display generating apparatus 20 is applied.

FIG. 6 is a diagram of a configuration example of the TV to which the image-for-display generating apparatus 20 shown in FIG. 2 is applied.

In FIG. 6, the TV 60 includes a storing unit 61, a signal processing unit 62, a gradation converting unit 63, and a blending unit 64.

The storing unit 61 corresponds to the storing unit 21 shown in FIG. 2. The storing unit 61 stores, for example, an image file in which an 8-bit image as a modulated image obtained by applying the ΔΣ modulation to the 16-bit image created by the designer as the original image of the menu screen is stored.

The signal processing unit 62 corresponds to the signal processing unit 22 shown in FIG. 2. The signal processing unit 62 applies necessary signal processing to the 8-bit image of the menu screen stored in the image file of the storing unit 61 and supplies the 8-bit image to the blending unit 64.

The 8-bit image stored in the image file of the storing unit 61 is, for example, an image half as large as the 16-bit image as the original image of the menu screen in both horizontal and vertical sizes.

Therefore, the signal processing unit 62 applies, as signal processing, expansion processing for expansion at an expansion ratio 2 to the 8-bit image of the menu screen stored in the image file of the storing unit 61 to obtain an 8-bit image having the same size as the original image and supplies the 8-bit image to the blending unit 64.

The gradation converting unit 63 corresponds to the gradation converting unit 23 shown in FIG. 2. The gradation converting unit 63 gradation-converts a combined image explained later from the blending unit 64 into an 8-bit image, supplies the 8-bit image to a not-shown 8-bit display, and causes the 8-bit display to display the 8-bit image.

The blending unit 64 combines the 8-bit image of the menu screen supplied from the signal processing unit 62 and an image of a program of a television broadcast or the like (hereinafter also referred to as content image) to generate a combined image and supplies the combined image to the gradation converting unit 63.

The blending unit 64 includes arithmetic units 65, 66, and 67 and performs so-called a blending using a predetermined coefficient α.

The 8-bit image of the menu screen from the signal processing unit 62 is supplied to the arithmetic unit 65. The arithmetic unit 65 multiplies the 8-bit image of the menu screen from the signal processing unit 62 with the coefficient α (α is a value in a range of 0 to 1) for the α blending and supplies a multiplied value obtained as a result of the multiplication to the arithmetic unit 67.

A content image is supplied to the arithmetic unit 66 from a not-shown tuner or the like. The arithmetic unit 66 multiplies the content image with a coefficient 1−α and supplies a multiplied value obtained as a result of the multiplication to the arithmetic unit 67.

The arithmetic unit 67 adds up the multiplied value from the arithmetic unit 65 and the multiplied value from the arithmetic unit 66 to thereby generate a combined image obtained by superimposing the menu screen on the content image and supplies the combined image to the gradation converting unit 63.

In the TV 60 configured as explained above, the signal processing unit 62 applies, as signal processing, the expansion processing for expansion at an expansion ratio 2 to the 8-bit image of the menu screen stored in the image file of the storing unit 61 to obtain an 8-bit image having the same size as the original image and supplies the 8-bit image to the blending unit 64.

In the blending unit 64, the arithmetic unit 65 multiplies the 8-bit image of the menu screen from the signal processing unit 62 with the coefficient α and supplies a multiplied value obtained as a result of the multiplication to the arithmetic unit 67. Further, the arithmetic unit 66 multiplies the content image with the coefficient 1−α and supplies a multiplied value obtained as a result of the multiplication to the arithmetic unit 67. The arithmetic unit 67 adds up the multiplied value from the arithmetic unit 65 and the multiplied value from the arithmetic unit 66 to thereby generate a combined image and supplies the combined image to the gradation converting unit 63.

The gradation converting unit 63 gradation-converts the combined image from the blending unit 64 into an 8-bit image, supplies the 8-bit image to the not-shown 8-bit display, and causes the 8-bit display to display the 8-bit image.

[A Configuration Example of the Image Processing Apparatus to which the Image-for-Storage Generating Apparatus 10 is Applied]

When, as explained above, the 8-bit image half as large as the 16-bit image as the original image of the menu screen (or the image file in which the 8-bit image is stored) is stored in the storing unit 61 of the TV 60 to which the image-for-display generating apparatus 20 is applied, an image processing apparatus to which the image-for-storage generating apparatus 10 is applied generates such an 8-bit image. The image processing apparatus is explained below.

Figure 7:
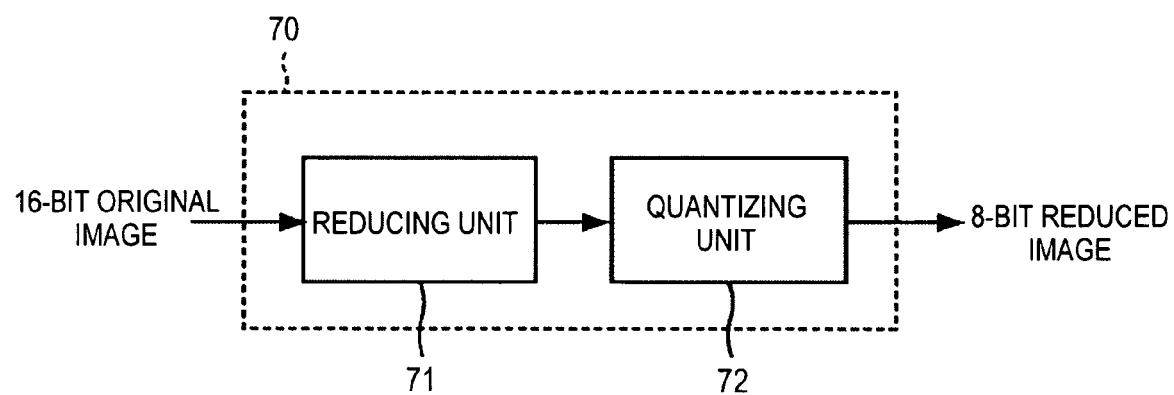
FIG. 7 is a block diagram of a configuration example of an image processing apparatus to which an image-for-storage generating apparatus 10 is applied.

FIG. 7 is a diagram of a configuration example of the image processing apparatus to which the image-for-storage generating apparatus 10 shown in FIG. 1 is applied.

In FIG. 7, an image processing apparatus 70 includes a reducing unit 71 and a quantization unit 72.

The 16-bit image as the original image of the menu screen is supplied to the reducing unit 71. The reducing unit 71 reduces the size of the 16-bit image as the original image of the menu screen according to a reduction ratio 1/2 corresponding to the expansion ratio of the expansion processing in the signal processing unit 62 (FIG. 6). The reducing unit 70 outputs a 16-bit reduced image (a reduced image including 16-bit components of R, G, and B) obtained by the reduction of the size to the quantization unit 72.

The quantization unit 72 corresponds to the quantization unit 11 shown in FIG. 1. The quantization unit 72 quantizes the 16-bit reduced image from the reducing unit 71 into 8 bits.

The image processing apparatus 70 stores an 8-bit reduced image obtained by the quantization in the quantization unit 72 in an image file and outputs the 8-bit reduced image.

[Images Treated by the Image Processing Apparatus 70 and Images Treated by the TV 60 when the 8-Bit Reduced Image Obtained by the Image Processing Apparatus 70 is Stored in the TV 60]

Images treated by the image processing apparatus 70 shown in FIG. 7 and images treated by the TV 60 when the 8-bit reduced image obtained by the image processing apparatus 70 is stored in the storing unit 61 of the TV 60 (FIG. 6) are explained below.

Figure 8A:
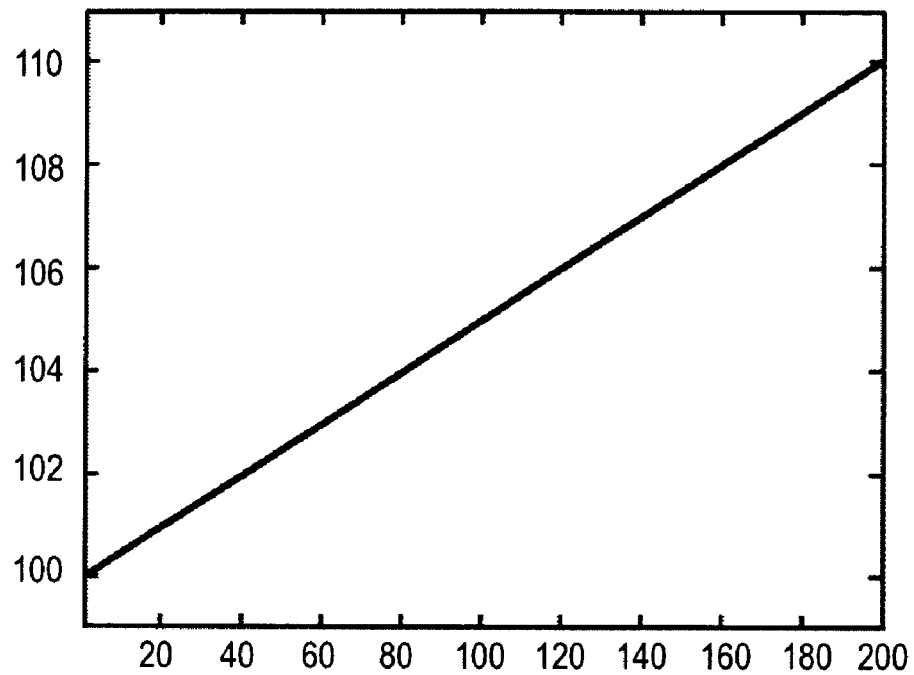
FIGS. 8A and 8B are graphs representing images treated by an image processing apparatus 70.
Figure 8B:
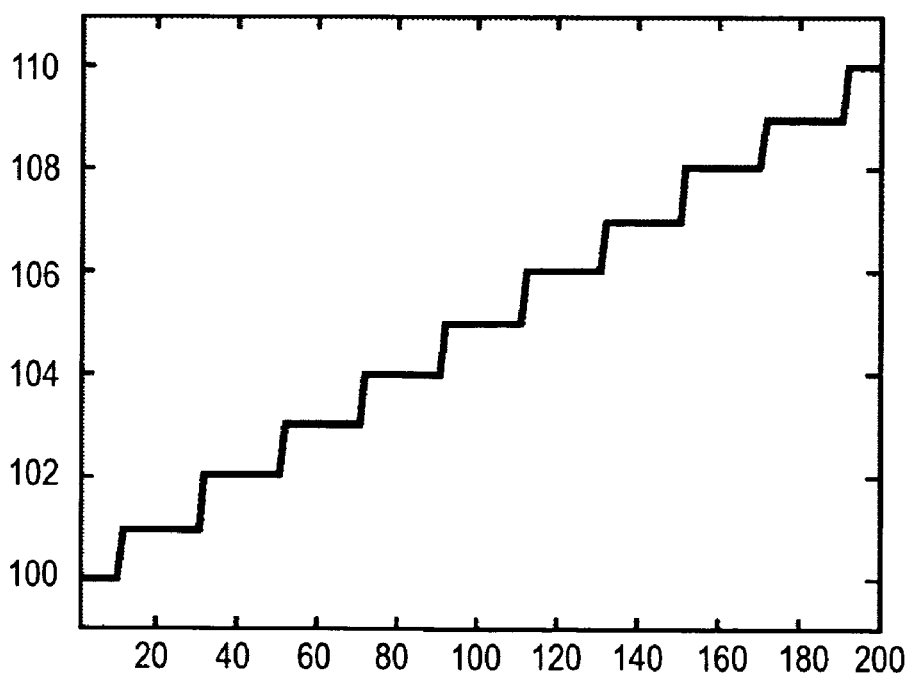

FIGS. 8A and 8B are graphs representing images treated by the image processing apparatus 70 shown in FIG. 7.

In FIGS. 8A and 8B (and FIGS. 9A and 9B to FIGS. 12A and 12B, FIG. 18, and FIGS. 19A to 19D referred to later), the abscissa represents positions of pixels arranged in the horizontal direction (or the vertical direction) and the ordinate represents pixel values.

FIG. 8A is a graph representing a 16-bit reduced image obtained by reducing the size of the 16-bit image as the original image of the menu screen to a half in the reducing unit 71 (FIG. 7).

In the 16-bit reduced image in FIG. 8A, pixel values of first pixel to a 200th pixel from the left smoothly (linearly) change from 100 to 110.

FIG. 8B is a graph representing an 8-bit reduced image obtained by quantizing the 16-bit reduced image in FIG. 8A into 8 bits in the quantization unit 72 (FIG. 7).

In the 8-bit reduced image in FIG. 8B, pixel values from a first pixel to a 200th pixel from the left change stepwise from 100 to 110. The gradation of the 8-bit reduced image lowers compared with the 16-bit reduced image in FIG. 8A because of the quantization by the quantization unit 72. Specifically, the 8-bit reduced image shown in FIG. 8B is changed to an image having $2^8$ gradations by the quantization by the quantization unit 72.

Figure 9A:
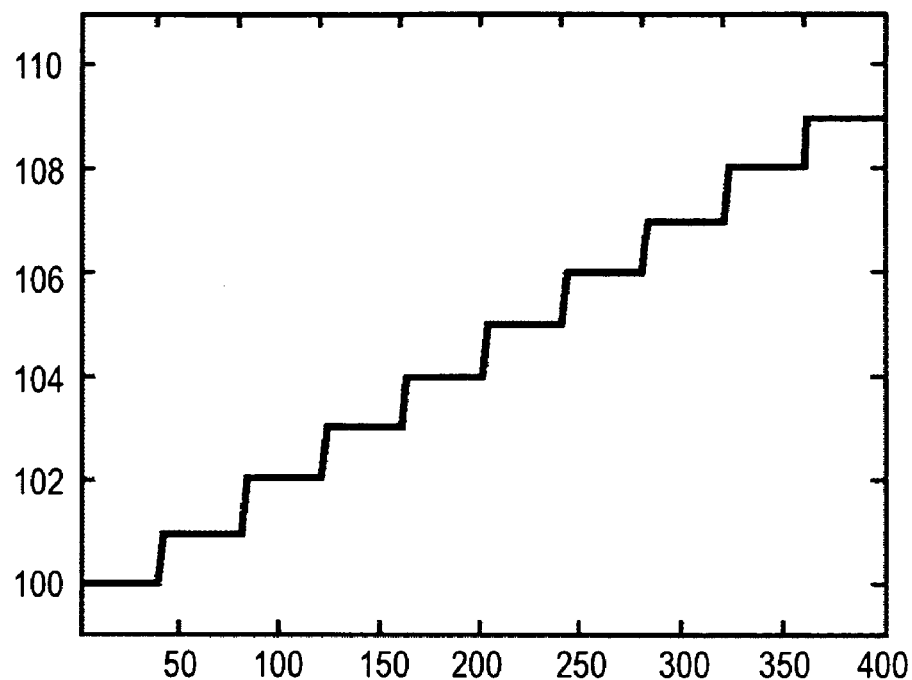
FIGS. 9A and 9B are graphs representing images treated by a TV 60.
Figure 9B:
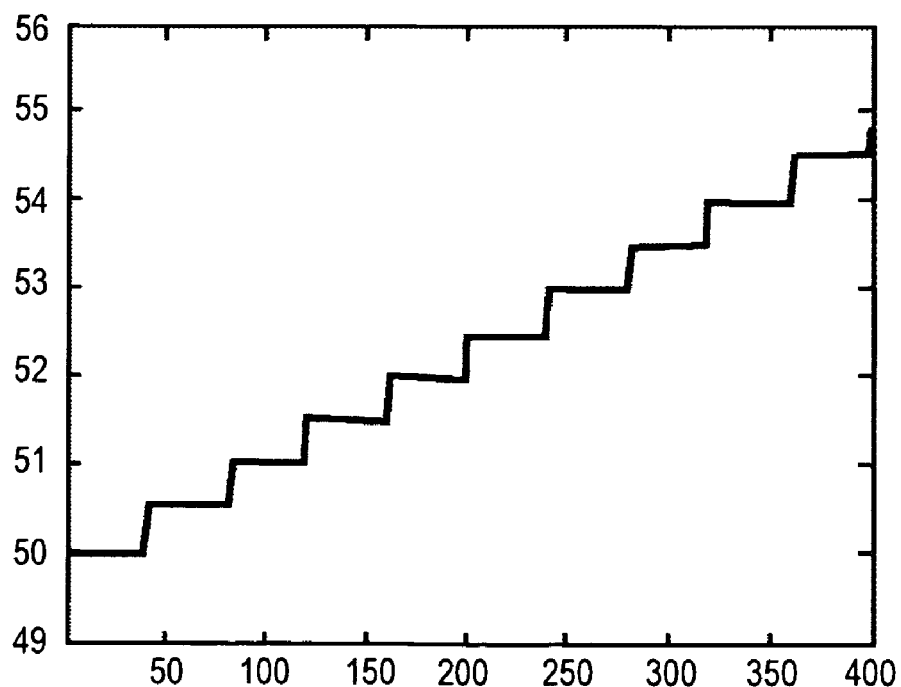

FIGS. 9A and 9B are graphs representing images treated by the TV 60 when the 8-bit reduced image shown in FIG. 8B is stored in the storing unit 61 of the TV 60 shown in FIG. 6.

Specifically, FIG. 9A is a graph representing an image having size same as the size of the original image of the menu screen (hereinafter also referred to as original size image) obtained by expanding the size of the 8-bit reduced image in FIG. 8B to double size in the signal processing unit 62 (FIG. 6).

In the original size image in FIG. 9A, pixel values of a first pixel to a 400th pixel from the left in a range twice as large as the range of the first pixel to the 200th pixel from the left change stepwise from 100 to 109. As in the case of FIG. 8B, the gradation of the image lowers compared with the 16-bit reduced image shown in FIG. 8A because of the quantization by the quantization unit 72.

FIG. 9B is a graph representing an image obtained by multiplying the original size image in FIG. 9A with the coefficient α (hereinafter also referred to as α-times image) in the arithmetic unit 65 (FIG. 6).

Specifically, FIG. 9B represents the α-times image obtained by the arithmetic unit 65 when the coefficient α is set to, for example, 0.5.

In the α-times image in FIG. 9B, pixel values of a first pixel to a 400th pixel from the left change stepwise from 50 to 54.5, which are 0.5 (=α) times as large as 100 to 109 in the case of FIG. 9A. As in the case of FIG. 8B and FIG. 9A, the gradation of the image lowers.

Figure 10A:
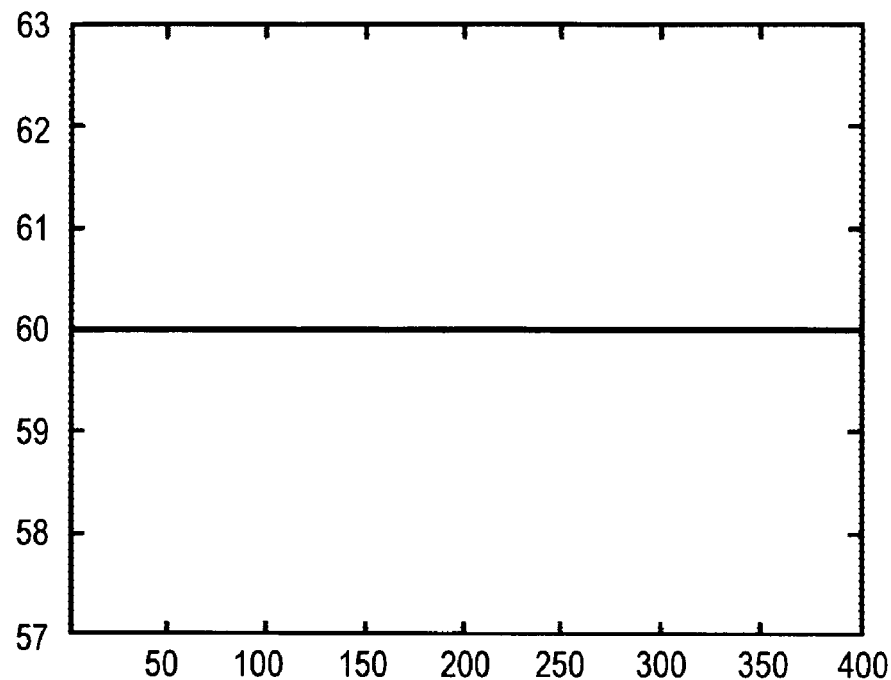
FIGS. 10A and 10B are graphs representing content images.
Figure 10B:
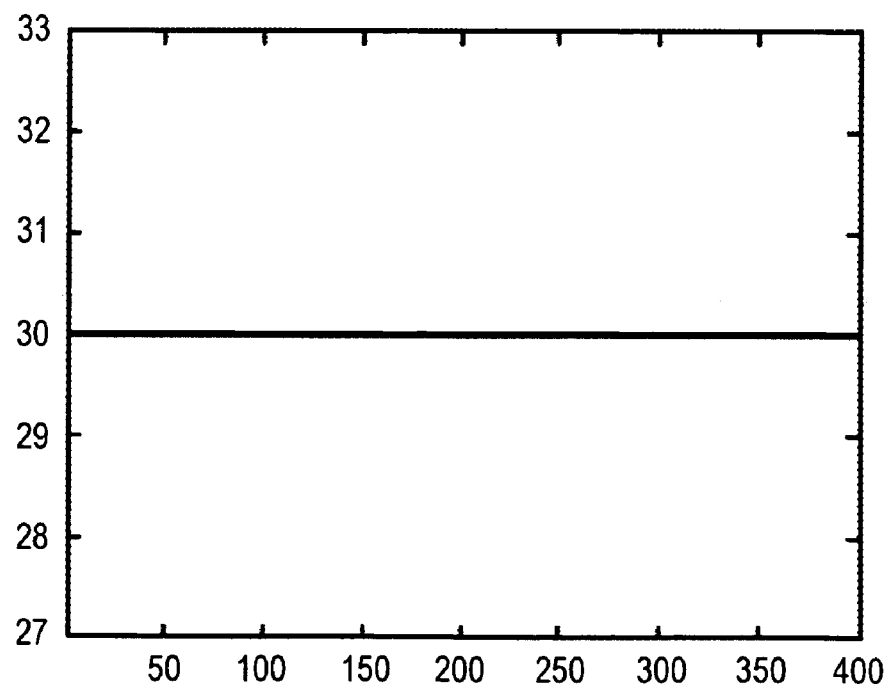

FIGS. 10A and 10B are graphs representing content images.

Specifically, FIG. 10A is a graph representing a content image supplied to the arithmetic unit 66 (FIG. 6).

In the content image in FIG. 10A, pixel values of a first pixel to 400th pixel from the left are a fixed value 60.

FIG. 10B is a graph representing an image obtained by multiplying the content image in FIG. 10A with the coefficient 1−α (hereinafter also referred to as 1−α-times image) in the arithmetic unit 66 (FIG. 6).

Specifically, FIG. 10B represents the 1−α-times image obtained by the arithmetic unit 66 when the coefficient α is set to 0.5 as explained with reference to FIGS. 9A and 9B.

In the 1−α-times image in FIG. 10B, pixel values of a first pixel to a 400th pixel from the left are 30 that is 0.5 (=1−α) times as large as 60 in the case of FIG. 10A.

Figure 11:
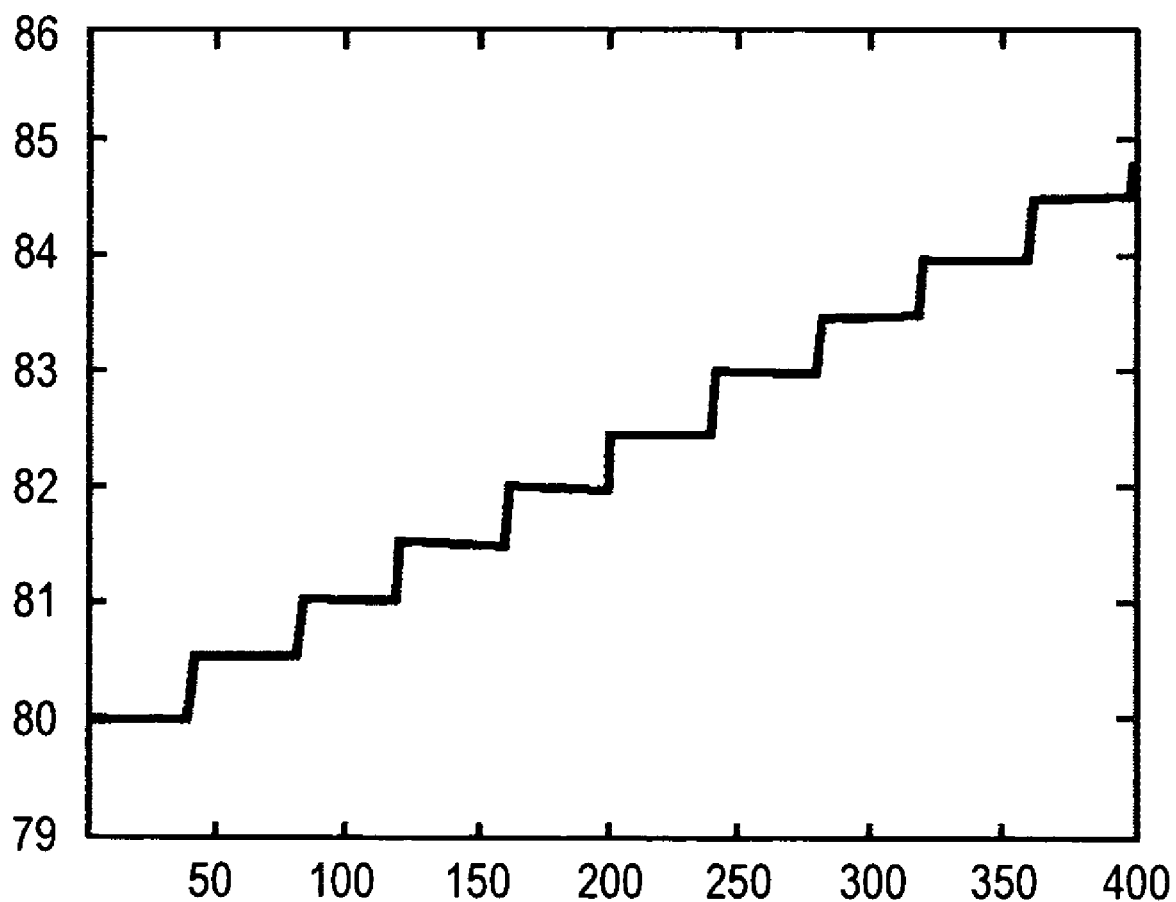
FIG. 11 is a graph representing a combined image.

FIG. 11 is a graph representing a combined image obtained by performing the α blending (combination) of the α-times image in FIG. 9B and the 1−α-times image in FIG. 10B in the arithmetic unit 67 (FIG. 6).

In the combined image in FIG. 11, the α-times image in FIG. 9B in which the pixel values of the first pixel to the 400th pixel from the left change stepwise from 50 to 54.5 and the 1−α-times image in FIG. 10B in which the pixel values of the first pixel to the 400th pixel from the left are 30 are added up. Therefore, in the combined image, pixel values of a first pixel to a 400th pixel from the left change stepwise from 80 to 84.5. As in the cases of FIG. 8B and FIG. 9A, the gradation of the combined image lowers.

Figure 12A:
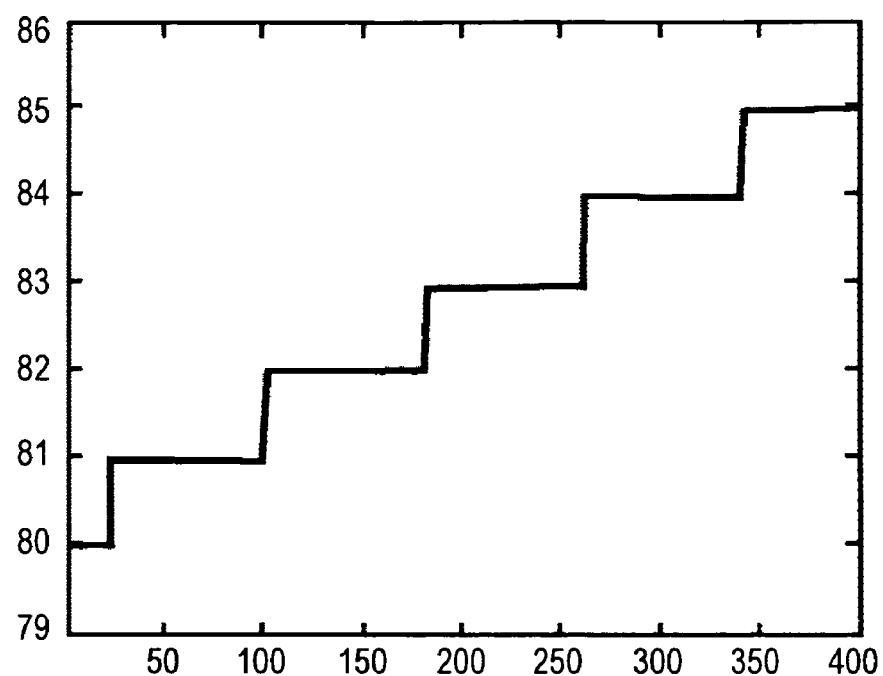
FIGS. 12A and 12B are graphs representing images after gradation conversion.
Figure 12B:
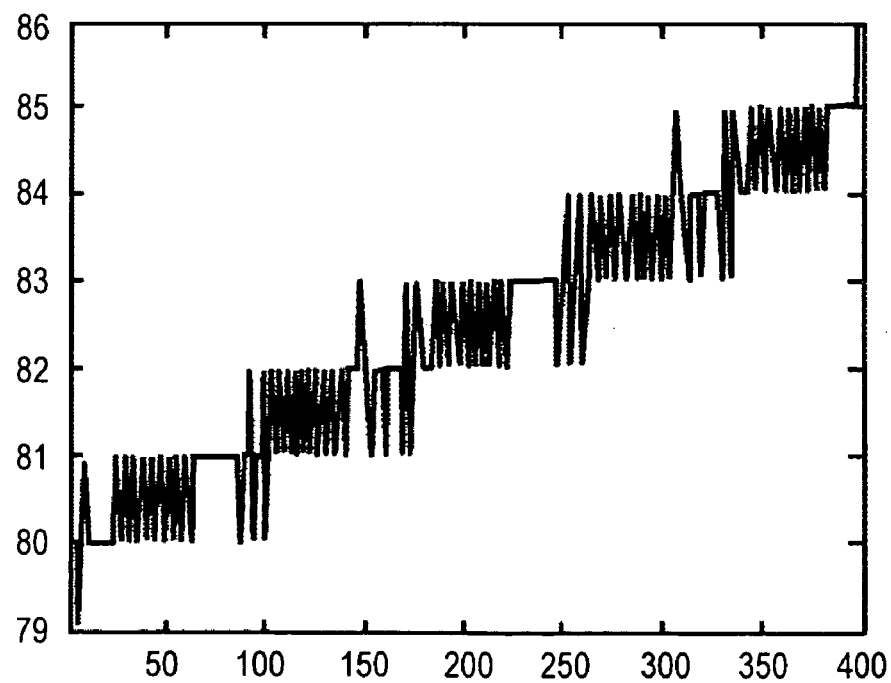

FIGS. 12A and 12B are graphs representing images after gradation conversion (hereinafter also referred to as post-gradation conversion image) obtained by gradation-converting the combined image in FIG. 11 into 8 bits.

Specifically, FIG. 12A is a graph representing a post-gradation conversion image obtained when the combined image in FIG. 11 is gradation-converted into 8 bits only by quantization in the gradation converting unit 63 (FIG. 6).

In the post-gradation conversion image in FIG. 12A, pixel values of a first pixel to a 400th pixel from the left change stepwise at a larger step from 80 to 85. The gradation of the post-gradation conversion image lowers more than those in the case of FIG. 11.

Specifically, the α-times image in FIG. 9B used for the generation of the combined image is an image obtained by multiplying the original size image in FIG. 9A with 0.5 ($=2^{-1}$) as the coefficient α. When such an α-times image (or the combined image generated by using the α-times image) is gradation-converted into 8 bits only by quantization, the α-times image is substantially converted into an image having $2^7$ gradations. Therefore, the gradation lowers below that before the gradation conversion.

FIG. 12B is a graph representing a post-gradation conversion image obtained when the combined image in FIG. 11 is gradation-converted into 8 bits by the dithering processing in the gradation converting unit 63 (FIG. 6).

In the post-gradation conversion image in FIG. 12B, pixel values change as if the pixel values are subjected to the PWM. It looks as if the pixel values changing in that way smoothly change because of the spatial integral effect of vision.

Specifically, in the post-gradation conversion image in FIG. 12B, concerning an image of the menu screen, gradation equivalent to that of the 8-bit reduced image stored in the storing unit 61 (FIG. 6) is simulatively realized.

However, in the post-gradation conversion image in FIG. 12B, the image of the menu screen is not an image having gradation equivalent to that of the 16-bit image as the original image of the menu screen.

As explained above, in the arithmetic unit 65 (FIG. 6), the original size image in FIG. 9A in which the pixel values change from 100 to 109 is multiplied with a (=0.5) to be the α-times image in FIG. 9B in which the pixel values change from 50 to 54.5.

Therefore, in the α-times image in FIG. 9B, the change in the pixel values is gentler than that of the original size image in FIG. 9A. Therefore, banding is more conspicuous in a combined image after gradation conversion obtained by gradation-converting such an α-times image (or the combined image generated by using the α-times image).

Specifically, in the combined image after gradation conversion of the image in which the change in the pixel values is gentle, a section in which fixed pixel values continue long increases. Therefore, banding in which a change in gradation looks like a band is conspicuous.

[A Configuration Example of an Image Processing Apparatus to Which the Image-for-Storage Generating Apparatus 30 is Applied]

In the post-gradation conversion image, to simulatively change the image of the menu screen to an image having gradation equivalent to that of the 16-bit image as the original image of the menu screen and to an image in which banding is not conspicuous, the image as the target of gradation conversion, i.e., the combined image obtained by the blending unit 64 (FIG. 6) needs to be the image having gradation equivalent to that of the 16-bit image.

Figure 13:
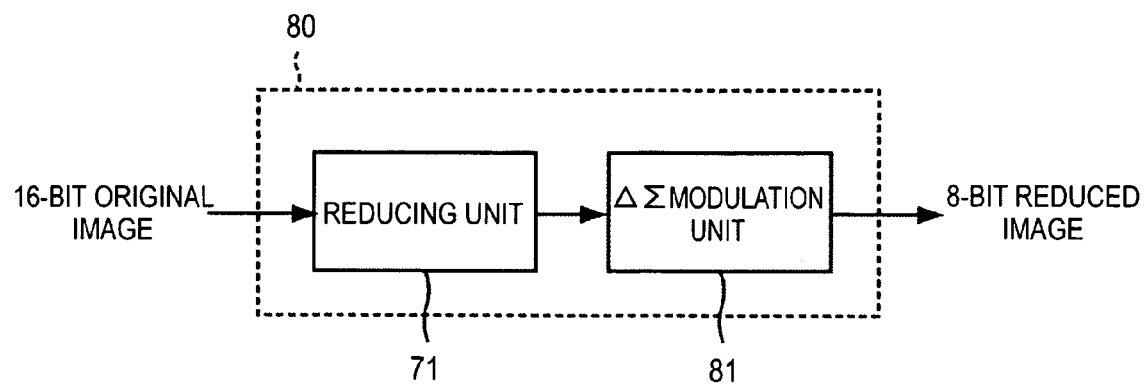
FIG. 13 is a block diagram of a configuration example of an image processing apparatus to which the image-for-storage generating apparatus 30 is applied.

FIG. 13 is a diagram of a configuration example of an image processing apparatus to which the image-for-storage generating apparatus 30 shown in FIG. 2 is applied.

In the figure, components corresponding to those of the image processing apparatus 70 shown in FIG. 7 are denoted by the same reference numerals. Explanation of the components is omitted below as appropriate.

Specifically, in FIG. 13, an image processing apparatus 80 includes the reducing unit 71 and a ΔΣ modulation unit 81. The image processing apparatus 80 is the same as the image processing apparatus 70 shown in FIG. 7 in that the image processing apparatus 80 includes the reducing unit 71. The image processing apparatus 80 is different from the image processing apparatus 70 shown in FIG. 7 in that the ΔΣ modulation unit 81 is provided instead of the quantization unit 72.

A 16-bit reduced image obtained by reducing the size of the 16-bit image as the original image of the menu screen at a reduction ratio 1/2 corresponding to the expansion ratio of the expansion processing in the signal processing unit 62 (FIG. 6) in the reducing unit 71 is supplied to the ΔΣ modulation unit 81.

The ΔΣ modulation unit 81 corresponds to the ΔΣ modulation unit 31 shown in FIG. 2. The ΔΣ modulation unit 81 applies the ΔΣ modulation to the 16-bit reduced image supplied from the reducing unit 71 and converts the 16-bit reduced image into an 8-bit reduced image.

The image processing apparatus 80 stores the 8-bit reduced image obtained by the ΔΣ modulation by the ΔΣ modulation unit 81 in an image file and outputs the 8-bit reduced image.

[A Frequency Characteristic of the Noise Shaping by the ΔΣ Modulation]

A frequency characteristic of the noise shaping by the ΔΣ modulation by the ΔΣ modulation unit 81 shown in FIG. 13 is a characteristic opposite to a frequency characteristic of signal processing performed by the signal processing unit 62 of the TV 60 (FIG. 6).

Therefore, to explain the frequency characteristic of the noise shaping by the ΔΣ modulation by the ΔΣ modulation unit 81, the frequency characteristic of the signal processing performed by the signal processing unit 62 is explained.

As explained with reference to FIG. 6, in the TV 60, the signal processing unit 62 applies, as signal processing, expansion processing for expansion at an expansion ratio 2 to the 8-bit image (the 8-bit reduced image) of the menu screen stored in the image file of the storing unit 61.

Figure 14:
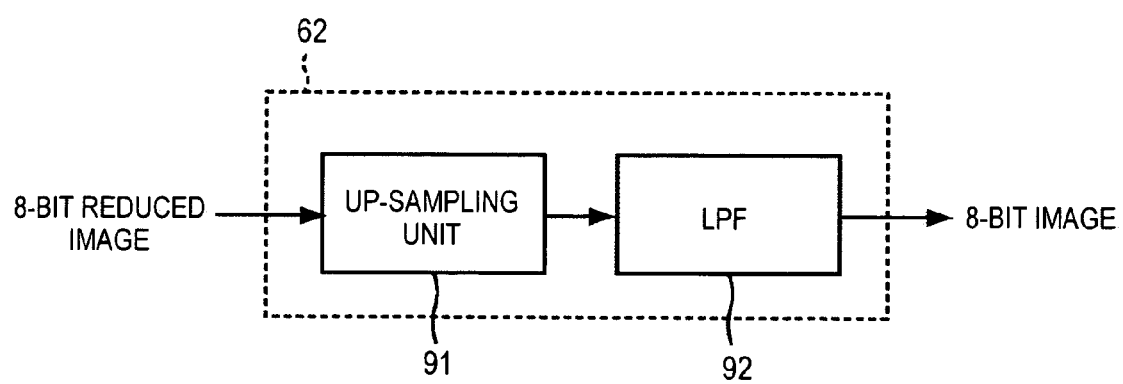
FIG. 14 is a block diagram of a configuration example of a signal processing unit 62.

FIG. 14 is a diagram of a configuration example of the signal processing unit 62 that performs such expansion processing as signal processing.

In FIG. 14, the signal processing unit 62 includes an up-sampling unit 91 and a LPF (Low Pass Filter) 92.

The 8-bit reduced image of the menu screen stored in the image file of the storing unit 61 (FIG. 6) is supplied to the up-sampling unit 91.

The up-sampling unit 91 interpolates pixels having pixel values 0 one by one among adjacent pixels forming the 8-bit reduced image to thereby generate an 8-bit image having a double size and supplies the 8-bit image to the LPF 92.

Specifically, the up-sampling unit 91 generates, according to the interpolation of the zero value, an image in which both the numbers of horizontal and vertical pixels are twice as large as those of the 8-bit reduced image and supplies the image to the LPF 92.

The LPF 92 filters the image supplied from the up-sampling unit 91 to thereby, for example, linearly interpolate the pixel values of the pixels in which the zero value is interpolated by the up-sampling unit 91. The LPF 92 supplies an image having a size same as that of the original image of the menu screen (an original size image) obtained as a result of the linear interpolation to the blending unit 64 (FIG. 6).

As explained above, the signal processing unit 62 interpolates the zero value in the 8-bit reduced image and performs the filtering with the LPF 92 to thereby perform expansion processing for expanding an image at an expansion ratio 2 (resizing processing for resetting the reduce image to the original size).

To simplify the explanation, attention is paid to only the horizontal direction of the 8-bit reduced image. The up-sampling unit 91 interpolates pixels having pixel values 0 one by one among pixels adjacent to one another in the horizontal direction to of the 8-bit reduced image thereby generate an image having a double size in the horizontal direction.

The up-sampling unit 91 doubles the pixel values of the pixels having the double size in the horizontal direction to prevent an average of the pixel values from changing and supplies the pixel values to the LPF 92.

The LPF 92 is a FIR filter in which, for example, filter coefficients for multiplying (pixel values of) three pixels continuous in the horizontal direction are 1/4, 1/2, and 1/4. The LPF 92 filters the image supplied from the up-sampling unit 91 in the horizontal direction. Consequently, the original size image obtained by linearly interpolating the pixel values of the pixels interpolated by the up-sampling unit 91 is output from the LPF 92.

When the signal processing unit 62 includes the up-sampling unit 91 and the LPF 92 as explained above, the frequency characteristic of the noise shaping by the $\Delta\Sigma$ modulation by the $\Delta\Sigma$ modulation unit 81 (FIG. 13) is a characteristic opposite to the frequency characteristic of the LPF 92.

Figure 15:
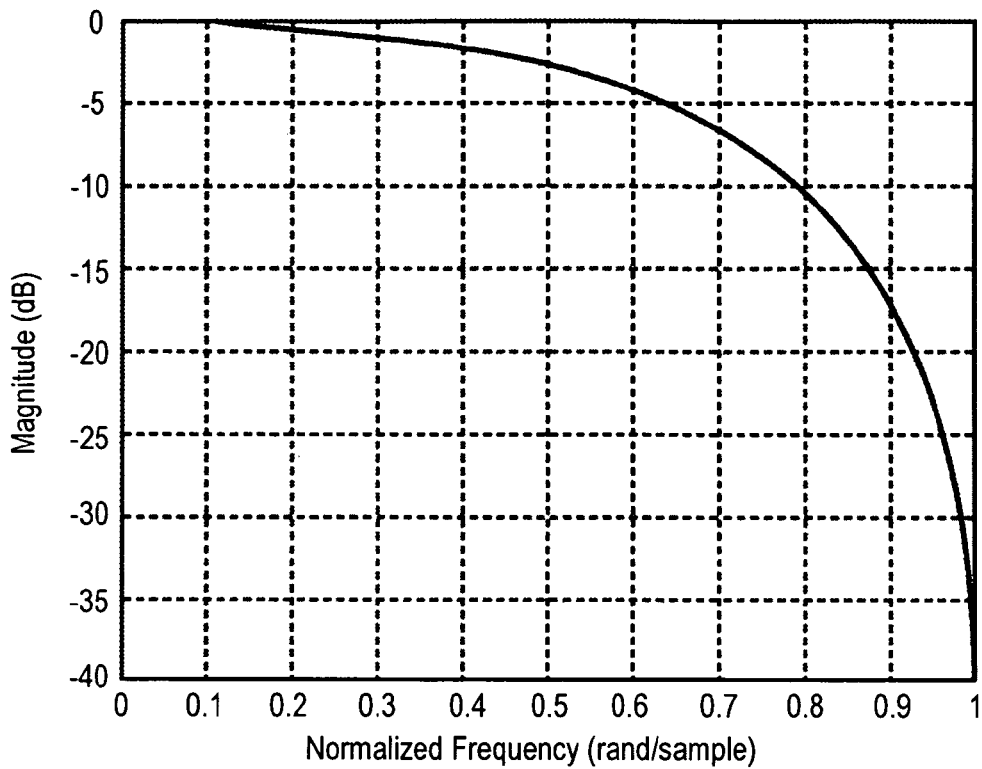
FIG. 15 is a graph of an amplitude characteristic of a LPF 92.

FIG. 15 is a graph of a frequency characteristic (an amplitude characteristic) of the LPF 92.

In FIG. 15 (and FIG. 16 referred to later), the abscissa represents a frequency with a half of a sampling frequency of pixels of an image (an image in which the zero value is interpolated) as a target of filtering by the LPF 92 normalized to 1 (hereinafter also referred to as normalized frequency). The ordinate represents a gain in a unit of dB.

The $\Delta\Sigma$ modulation unit 81 (FIG. 13) performs the $\Delta\Sigma$ modulation targeting the 8-bit reduced image having a size half as large as the size of the image (the image in which the zero value is interpolated) as the target of the filtering by the LPF 92 (hereinafter also referred to as zero-interpolated image).

A sampling frequency of the pixels of the 8-bit reduced image as the target of the $\Delta\Sigma$ modulation is a half of a sampling frequency of the pixels of the zero-interpolated image as the target of the filtering by the LPF 92.

Therefore, concerning the 8-bit reduced image as the target of the $\Delta\Sigma$ modulation, since a portion having a normalized frequency equal to or lower than 0.5 in the frequency characteristic of the LPF 92 affects the filtering by the LPF 92, only that portion has to be taken into account.

Figure 16:
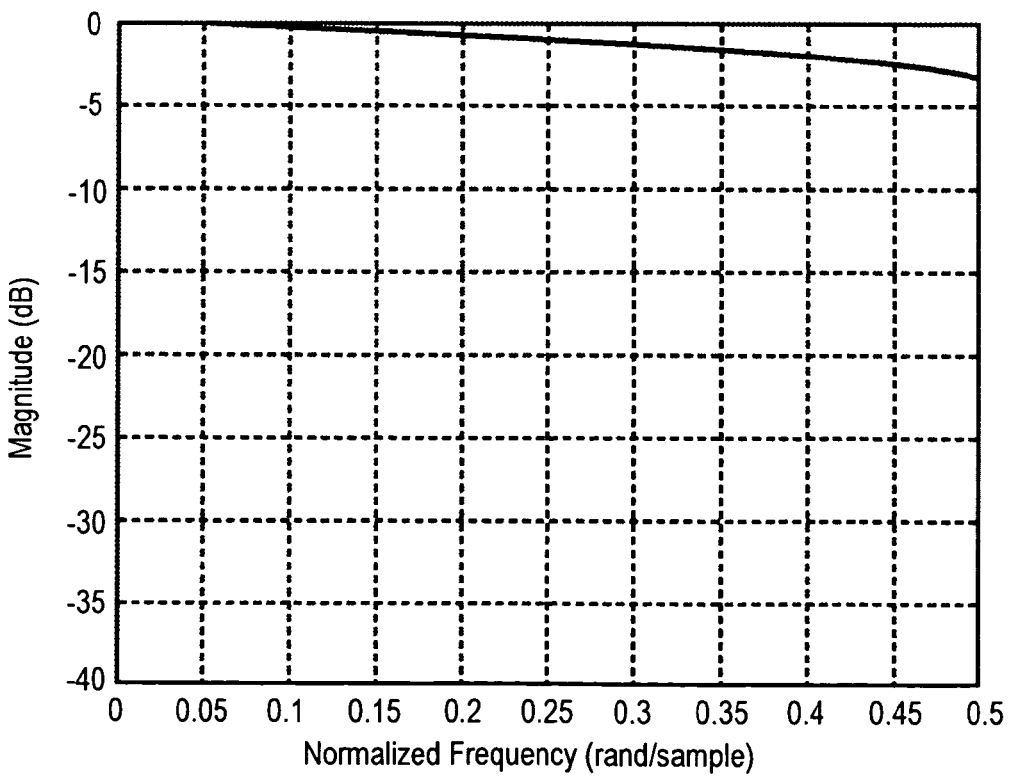
FIG. 16 is a graph of an amplitude characteristic of the LPF 92.

FIG. 16 is a graph of the portion having the normalized frequency equal to or lower than 0.5 in the frequency characteristic of the LPF 92 shown in FIG. 15.

The frequency characteristic of the noise shaping by the $\Delta\Sigma$ modulation by the $\Delta\Sigma$ modulation unit 81 (FIG. 13) is a characteristic opposite to the frequency characteristic shown in FIG. 16.

Figure 17:
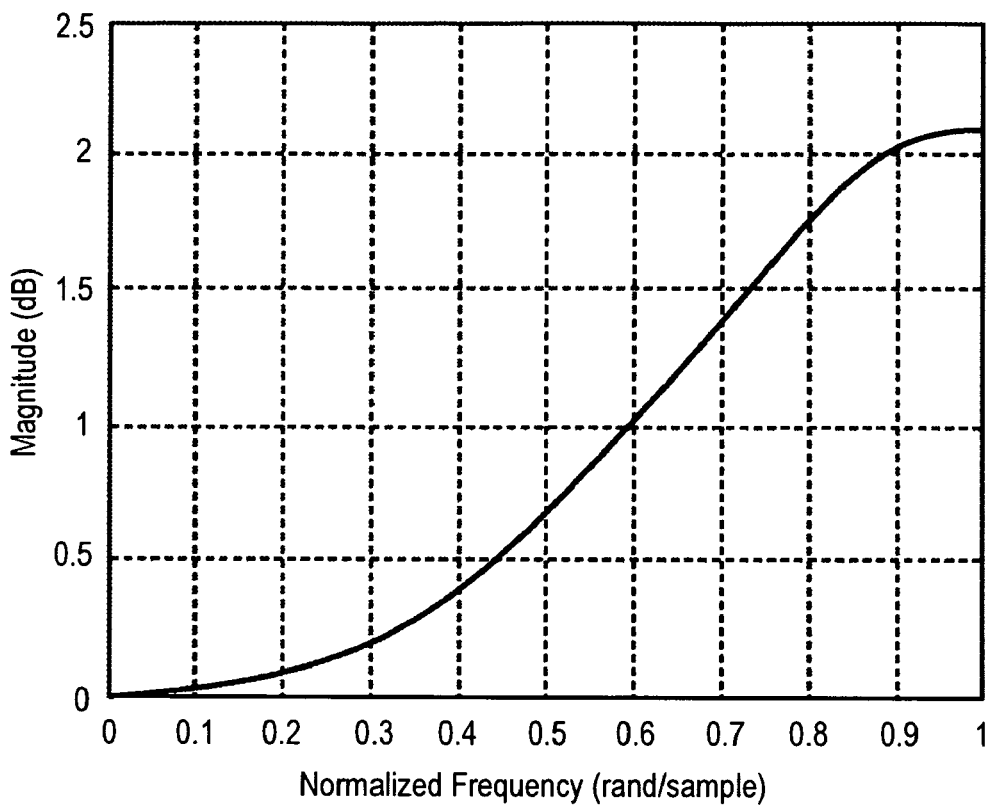
FIG. 17 is a graph of an amplitude characteristic of noise shaping by $\Delta\Sigma$ modulation.

FIG. 17 is a graph of a frequency characteristic (an amplitude characteristic) of the noise shaping by the $\Delta\Sigma$ modulation by the $\Delta\Sigma$ modulation unit 81 (FIG. 13).

In FIG. 17, the abscissa represents a frequency with a half of a sampling frequency of pixels of an 8-bit reduced image as a target of the $\Delta\Sigma$ modulation normalized to 1 (a normalized frequency). The ordinate represents a gain in a unit of dB.

A normalized frequency 1 in FIG. 17 corresponds to the normalized frequency 0.5 of the frequency characteristic of the LPF 92 (FIG. 14) shown in FIGS. 15 and 16.

The frequency characteristic of the noise shaping shown in FIG. 17 is a characteristic that, when the normalized frequency is 0, a gain is 0 and, as the normalized frequency is in a higher band (a higher band of a spatial frequency), a gain is larger. The frequency characteristic is (substantially) opposite to the frequency characteristic shown in FIG. 16.

The frequency characteristic of the noise shaping does not need to completely coincide with an opposite characteristic obtained by reversing the frequency characteristic of the signal processing unit 62 (FIG. 6), namely here, the frequency characteristic of the LPF 92 (FIG. 14) (the portion having the normalized frequency equal to or lower than 0.5 (FIG. 16)).

According to the frequency characteristic shown in FIG. 16, concerning the 8-bit reduced image as the target of the $\Delta\Sigma$ modulation, a high-frequency component of the spatial frequency is attenuated by the filtering by the LPF 92.

The $\Delta\Sigma$ modulation unit 81 (FIG. 13) adds a high-frequency noise (a quantization error) attenuated (averaged) by the filtering by the LPF 92 to perform the $\Delta\Sigma$ modulation such that the original size image obtained by the filtering by the LPF 92 is an image having gradation equivalent to that of the 16-bit image.

Therefore, the frequency characteristic of the noise shaping by the $\Delta\Sigma$ modulation only has to be a characteristic that noise (a quantization error) corresponding to the frequency characteristic is attenuated (ideally, completely) by the filtering by the LPF 92.

In other words, the frequency characteristic of the noise shaping by the $\Delta\Sigma$ modulation only has to be a characteristic of a shape similar to a shape obtained by reversing the frequency characteristic of the LPF 92 (the portion having the normalized frequency equal to or lower than 0.5 (FIG. 16)).

In this specification, when the frequency characteristic of the noise shaping is a characteristic opposite to the frequency characteristic of the signal processing unit 62 (FIG. 6), this means that the frequency characteristic of the noise shaping completely coincides with the characteristic opposite to the frequency characteristic of the signal processing by the signal processing unit 62. Besides, this also means that the frequency characteristic of the noise shaping is similar to the opposite characteristic.

The $\Delta\Sigma$ modulation unit 81 is configured the same as the $\Delta\Sigma$ modulation unit 31 shown in FIG. 3. However, the frequency characteristic of the noise shaping by the $\Delta\Sigma$ modulation by the $\Delta\Sigma$ modulation unit 81 depends on a transfer function G of the filter 44 (FIG. 3) and a filter coefficient of the filter 44.

For example, as explained above, the signal processing by the signal processing unit 62 (FIG. 6) is expansion processing for expanding the size of an image to double size with linear interpolation and the filter 44 is the 12-tap two-dimensional FIR filter as shown in FIG. 4. In this case, the filter coefficient a(x,y) (FIG. 4) of the filter 44 for setting the frequency characteristic of the noise shaping by the $\Delta\Sigma$ modulation by the $\Delta\Sigma$ modulation unit 81 to the characteristic opposite to the frequency characteristic of the signal processing by the signal processing unit 62 is, for example, as follows:

a(1,1)=−0.0064
a(2,1)=−0.0256
a(3,1)=−0.0384
a(4,1)=−0.0256
a(5,1)=−0.0064
a(1,2)=−0.0256
a(2,2)=0.1816
a(3,2)=0.4144
a(4,2)=0.1816
a(5,2)=−0.0256
a(1,3)=−0.0384
a(2,3)=0.4144

[Images Treated by the Image Processing Apparatus 80 and Images Treated by the TV 60 when an 8-Bit Reduced Image Obtained by the Image Processing Apparatus 80 is Stored in the TV 60]

Images treated by the image processing apparatus 80 shown in FIG. 13 and images treated by the TV 60 when an 8-bit reduced image obtained by the image processing apparatus 80 is stored in the storing unit 61 of the TV 60 (FIG. 6) are explained below.

Figure 18:
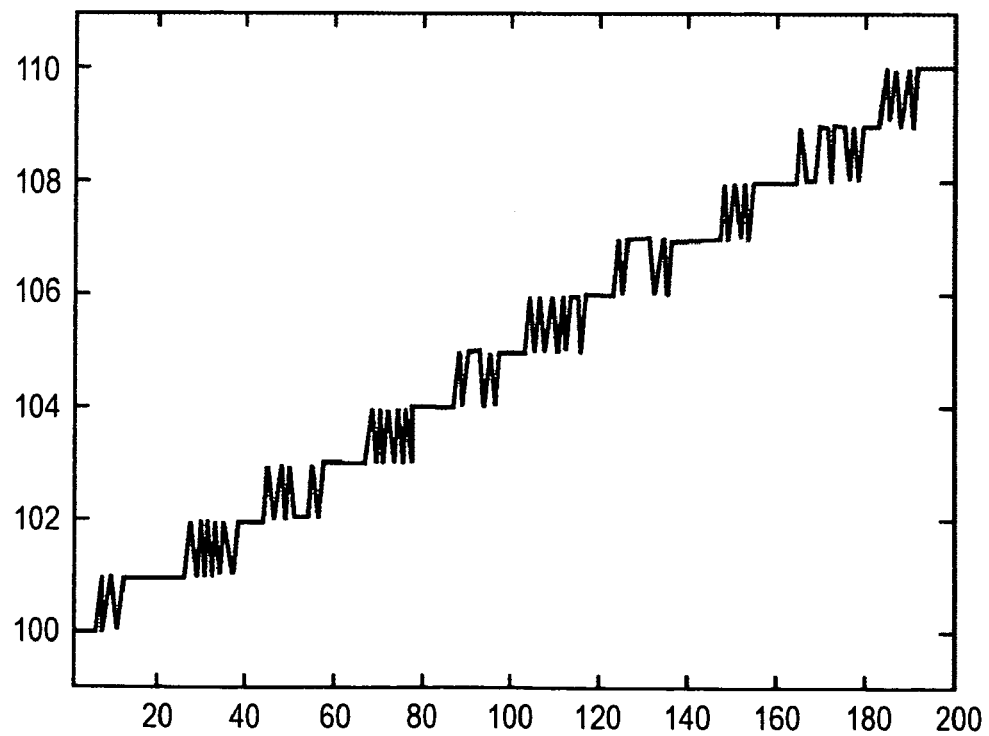
FIG. 18 is a graph representing an image treated by an image processing apparatus 80.

FIG. 18 is a graph representing an image treated by the image processing apparatus 80 shown in FIG. 13.

Specifically, FIG. 18 represents an 8-bit reduced image as a modulated image obtained by applying the $\Delta\Sigma$ modulation to the 16-bit reduced image in FIG. 8A obtained by the reducing unit 71 in the $\Delta\Sigma$ modulation unit 81 (FIG. 13).

In the 8-bit reduced image as the modulated image in FIG. 18, pixel values change as if the pixel values are subjected to the PWM. It looks as if the pixel values changing in that way smoothly change because of the spatial integral effect of vision.

Specifically, in the 8-bit reduced image as the modulated image in FIG. 18, gradation equivalent to that of the 16-bit reduced image (FIG. 8A) before being subjected to the $\Delta\Sigma$ modulation is simulatively realized.

FIGS. 19A to 19D are graphs representing images treated by the TV 60 when the 8-bit reduced image in FIG. 18 is stored in the storing unit 61 of the TV 60 shown in FIG. 6.

In FIGS. 19A to 19D, pixel values of a first pixel to a 400th pixel from the left are shown.

Figure 19A:
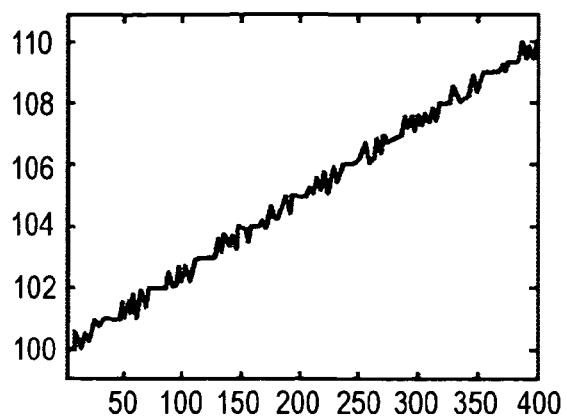
FIGS. 19A to 19D are graphs representing images treated by the TV 60.

FIG. 19A is a graph representing the size of an original size image obtained by expanding the 8-bit reduced image in FIG. 18 to double size in the signal processing unit 62 (FIG. 6).

As explained above, in the signal processing unit 62 (FIG. 14), the signal processing as the expansion processing for interpolating the zero value and performing the filtering by the LPF 92 is performed. The noise (the quantization error) having the characteristic opposite to the frequency characteristic of the LPF 92 is added to the 8-bit reduced image in FIG. 18 (the $\Delta\Sigma$ modulation for performing the noise shaping of the frequency characteristic opposite to the frequency characteristic of the LPF 92 is applied to the 8-bit reduced image).

Therefore, when the signal processing as the expansion processing by the signal processing unit 62 is applied to the 8-bit reduced image in FIG. 18, the noise added to the reduced image is attenuated (averaged). As a result, the original size image obtained by the signal processing as the expansion processing by the signal processing unit 62 is an image obtained by, so to speak, restoring the 16-bit image (the original image of the menu screen) simulatively realized by the spatial integral effect of vision.

Figure 19B:
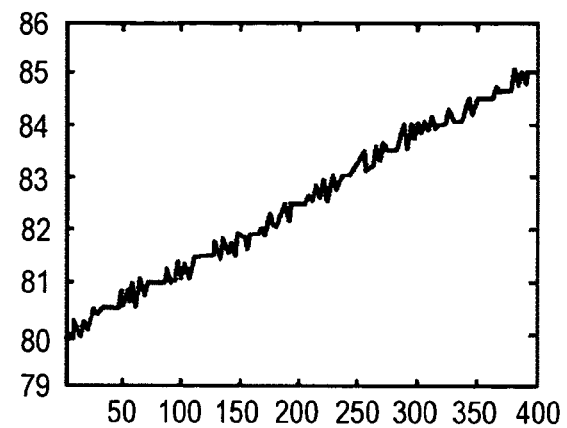

FIG. 19B is a graph representing a combined image obtained by setting the coefficient $\alpha$ to, for example, 0.5 and adding up an image obtained by multiplying the original size image in FIG. 19A with the coefficient $\alpha$ (an $\alpha$-times image) and the 1–$\alpha$-times image in FIG. 10B in the blending unit 64 (FIG. 6).

It is seen that the combined image in FIG. 19B is an image having a high gradation compared with the combined image in FIG. 11.

Figure 19C:
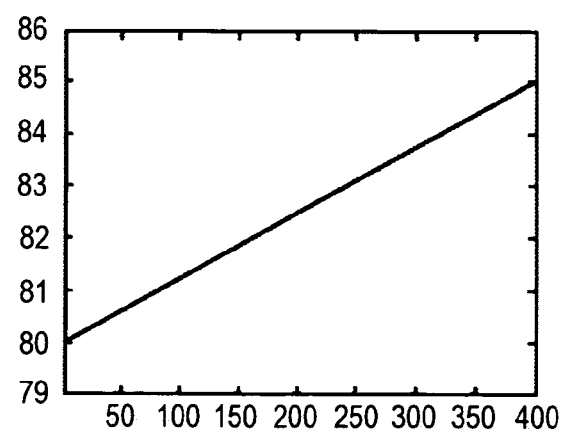

FIG. 19C is a graph representing, so to speak, an ideal combined image obtained by setting the coefficient $\alpha$ to 0.5 and performing the a blending of an image obtained by multiplying the 16-bit image as the original image of the menu screen with the coefficient $\alpha$ (an $\alpha$-times image) and the 1–$\alpha$-times image in FIG. 10B.

The combined image in FIG. 19B is an image having gradation closer (more similar) to that of the ideal combined image in FIG. 19C than the gradation of the combined image in FIG. 11.

Figure 19D:
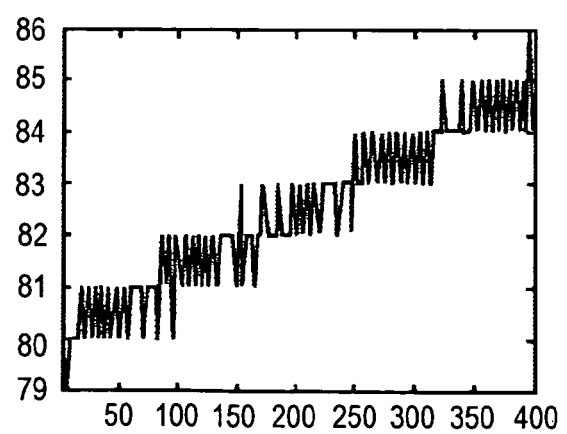

FIG. 19D is a graph representing a post-gradation conversion image obtained by gradation-converting the combined image in FIG. 19B into 8 bits with the dithering processing in the gradation converting unit 63 (FIG. 6).

In the post-gradation conversion image in FIG. 19D, pixel values change as if the pixel values are subjected to the PWM. It looks as if the pixel values changing in that way smoothly change because of the spatial integral effect of vision.

Specifically, the combined image as the target of the gradation conversion by the dithering processing in the gradation converting unit 63 (FIG. 6) is, as shown in FIG. 19B, the image close to the ideal combined image in FIG. 19C and has gradation close to that of the ideal combined image.

In the post-gradation conversion image obtained by performing the dithering processing of such a combined image, gradation equivalent to that of the combined image before the gradation conversion is simulatively realized (by the spatial integral effect of vision).

Specifically, in the post-gradation conversion image in FIG. 19D, concerning an image of the menu screen, gradation substantially equivalent to that of the 16-bit image as the original image of the menu screen is simulatively realized.

Therefore, in the TV 60 (FIG. 6), when the expansion processing is applied to the image of the menu screen as predetermined signal processing, the gradation of an image obtained by the expansion processing as the predetermined signal processing can be improved.

The combined image as the target of the gradation conversion by the dithering processing in the gradation converting unit 63 (FIG. 6) has, as shown in FIG. 19B, the gradation close to that of the ideal combined image in FIG. 19C. Therefore, in an image obtained by gradation-converting the combined image, banding can be prevented from occurring compared with the image obtained by gradation-converting the combined image in which pixel values change stepwise shown in FIG. 11.

As explained above, the $\Delta\Sigma$ modulation, the frequency characteristic of the noise shaping by which is the characteristic opposite to the frequency characteristic of the signal processing by the signal processing unit 62 of the TV (FIG. 6), is applied to the 16-bit reduced image obtained by reducing the original image of the menu screen to gradation-convert the 16-bit reduced image into an 8-bit reduced image as a modulated image and store the 8-bit reduced image in the TV 60. This allows the TV 60 to display an image of a menu screen having a high gradation close to that of the original image of the menu screen without providing special hardware or software.

The image processing apparatus 80 (FIG. 13) can set, besides an image as a UI (User Interface) such as the image (the original image) of the menu screen, a photographed image of a real world and the like as a processing target.

The image processing apparatus 80 can set both a still image and a moving image as processing targets.

The expansion processing as the signal processing by the signal processing unit 62 of the TV 60 (FIG. 6) can be performed by, besides the linear interpolation, nearest neighbor interpolation, cubic interpolation, and the like.

As the expansion processing by the signal processing unit 62, processing for expanding an image at an expansion ratio other than 2 can be adopted.

The signal processing by the signal processing unit 62 is not limited to the expansion processing.

[A Configuration Example of a Computer According to an Embodiment of the Present Invention]

The series of processing explained above can be performed by hardware and can be performed by software. When the series of processing is performed by software, a computer program configuring the software is installed in a general-purpose computer or the like.

FIG. 20 is a diagram of a configuration example of a computer according to an embodiment of the present invention in which the computer program for executing the series of processing is installed.

The computer program can be recorded in advance on a hard disk 105 and a ROM (Read Only Memory) 103 as recording media incorporated in the computer.

Alternatively, the computer program can be temporarily or permanently stored (recorded) on a removable recording medium 111 such as a flexible disk, a CD-ROM (Compact Disc Read Only Memory), an MO (Magneto Optical) disk, a DVD (Digital Versatile Disc), a magnetic disk, or a semiconductor memory. Such a removable recording medium 111 can be provided as so-called package software.

Besides being installed in the computer from the removable recording medium 111 explained above, the computer program can be transferred from a download site to the computer by radio via an artificial satellite for a digital satellite broadcast or can be transferred to the computer by wire via a network such as a LAN (Local Area Network) or the Internet. The computer can receives the computer program transferred in that way in a communication unit 108 and install the computer program in the hard disk 105 incorporated therein.

The computer incorporates a CPU (Central Processing Unit) 102. An input and output interface 110 is connected to the CPU 102 via a bus 101. When, for example, a user operates an input unit 107 including a keyboard, a mouse, and a microphone to input a command via the input and output interface 110, the CPU 102 executes the computer program stored in the ROM (Read Only Memory) 103 according to the command. The CPU 102 loads the computer program stored in the hard disk 105, the computer program transferred from the satellite or the network, received by the communication unit 108, and installed in the hard disk 105, or the computer program read out from the removable recording medium 111, which is inserted in a drive 109, and installed in the hard disk 105 to a RAM (Random Access Memory) 104 and executes the computer program. Consequently, the CPU 102 performs processing conforming to the flowcharts explained above or processing performed by the components shown in the block diagrams explained above. For example, the CPU 102 outputs a result of the processing from an output unit 106 including an LCD (Liquid Crystal Display) or a speaker or transmits the processing result from the communication unit 108 via the input and output interface 110 or causes the hard disk 105 to record the processing result according to necessity.

In this specification, processing steps describing a computer program for causing the computer to execute various kinds of processing do not always have to be processed in time series according to the order described as the flowcharts and include processing executed in parallel or individually (e.g., parallel processing or processing by an object).

The computer program may be processed by one computer or may be subjected to distributed processing by plural computers. Further, the computer program may be transferred to a remote computer and executed.

Embodiments of the present invention are not limited to the embodiments explained above. Various modifications of the embodiments are possible without departing from the spirit of the present invention.

What is claimed is:

1. An image processing apparatus comprising:

an input to receive a signal representative of an original image;

reducing means for reducing the original image at a reduction ratio and outputting a reduced image; and $\Delta\Sigma$ modulation means for applying, when predetermined signal processing is applied to a modulated image obtained by applying $\Delta\Sigma$ modulation to an image in a signal processing unit, the $\Delta\Sigma$ modulation to the reduced image, wherein a frequency characteristic of noise shaping by the $\Delta\Sigma$ modulation is a characteristic opposite to a frequency characteristic of the predetermined signal processing.

2. An image processing apparatus comprising:

an input to receive a signal representative of an original image;

$\Delta\Sigma$ modulation means for applying, when predetermined signal processing is applied to a modulated image obtained by applying $\Delta\Sigma$ modulation to an image in a signal processing unit, the $\Delta\Sigma$ modulation to the image, wherein a frequency characteristic of noise shaping by the $\Delta\Sigma$ modulation is a characteristic opposite to a frequency characteristic of the predetermined signal processing, and wherein, when the signal processing unit interpolates a zero value and performing filtering by an LPF (Low Pass Filter) to thereby apply, as the predetermined signal processing, expansion processing for expanding an image at a predetermined expansion ratio, the frequency characteristic of the noise shaping by the $\Delta\Sigma$ modulation is a characteristic opposite to a frequency characteristic of the LPF, said apparatus further comprising reducing means for reducing the original image at a reduction ratio corresponding to the expansion ratio and outputting a reduced image, wherein the $\Delta\Sigma$ modulation means applies the $\Delta\Sigma$ modulation to the reduced image.

3. An image processing method comprising:

reducing an original image at a reduction ratio and outputting a reduced image; and applying, when predetermined signal processing is applied to a modulated image obtained by applying $\Delta\Sigma$ modulation to an image in a signal processing unit, the $\Delta\Sigma$ modulation to the reduced image, wherein a frequency characteristic of noise shaping by the $\Delta\Sigma$ modulation is a characteristic opposite to a frequency characteristic of the predetermined signal processing, and wherein the reducing and the applying are performed by a processing device.

4. A non-transitory computer readable medium having stored thereon a computer program for causing a computer to function as:

reducing means for reducing an original image at a reduction ratio and outputting a reduced image; and $\Delta\Sigma$ modulation means for applying, when predetermined signal processing is applied to a modulated image obtained by applying $\Delta\Sigma$ modulation to an image in a signal processing unit, the $\Delta\Sigma$ modulation to the reduced image, wherein a frequency characteristic of noise shaping by the $\Delta\Sigma$ modulation is a characteristic opposite to a frequency characteristic of the predetermined signal processing.

5. An image processing apparatus comprising:
  a reducing unit to reduce an original image at a reduction ratio and outputting a reduced image; and
  a ΔΣ modulation unit configured to apply, when predetermined signal processing is applied to a modulated image obtained by applying ΔΣ modulation to an image in a signal processing unit, the ΔΣ modulation to the reduced image,
  wherein a frequency characteristic of noise shaping by the ΔΣ modulation is a characteristic opposite to a frequency characteristic of the predetermined signal processing, and
  wherein at least one of the ΔΣ modulation unit and the reducing unit are configured by hardware.

* * * * *